United States Patent
Nakashima et al.

(10) Patent No.: US 7,752,999 B2
(45) Date of Patent: Jul. 13, 2010

(54) WET PROCESSING SYSTEM, WET PROCESSING METHOD AND STORAGE MEDIUM

(75) Inventors: Tsunenaga Nakashima, Koshi (JP); Michio Kinoshita, Koshi (JP); Kousuke Nakamichi, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 81 days.

(21) Appl. No.: 11/877,991

(22) Filed: Oct. 24, 2007

(65) Prior Publication Data

US 2008/0100809 A1    May 1, 2008

(30) Foreign Application Priority Data

Oct. 25, 2006 (JP) .............................. 2006-289346
Apr. 27, 2007 (JP) .............................. 2007-119572

(51) Int. Cl.
*B05C 11/00* (2006.01)
(52) U.S. Cl. ...................................... 118/712; 118/679
(58) Field of Classification Search ................. 118/712, 118/707, 679, 699, 682, 684, 695–698, 52, 118/64, 302, 315
See application file for complete search history.

(56) References Cited

U.S. PATENT DOCUMENTS

2004/0173144 A1* 9/2004 Edwards et al. ............. 118/300

FOREIGN PATENT DOCUMENTS

| JP | 11-176734 | 7/1999 |
| JP | 2003-136015 | 5/2003 |

* cited by examiner

*Primary Examiner*—Brenda A Lamb
(74) *Attorney, Agent, or Firm*—Oblon, Spivak, McClelland, Maier & Neustadt, L.L.P.

(57) ABSTRACT

A wet processing system detects a globule of a process solution in a drippy or dripping state from the tip of any one of process solution pouring nozzles being moved to a pouring position for pouring the process solution onto a substrate by obtaining image data on the process solution pouring nozzle, and takes proper measures to prevent the process solution from dripping. A wet processing system 1 pours a process solution, such as a resist solution, through one of process solution pouring nozzles 10 onto a surface of a substrate, such as a wafer W, held substantially horizontally by a substrate holding device 41 surrounded by a cup 5 to process the surface by a wet process. A nozzle carrying mechanism 10a carries the process solution pouring nozzles 10 between a home position on a nozzle bath 14 and a pouring position above the substrate held by the substrate holding device 41. An optical image of the tips of the process solution pouring nozzles 10 is obtained by an image pickup means, such as a camera 17. Predetermined measures are taken according to the level of a drippy or dripping state of a globule of the process solution.

21 Claims, 13 Drawing Sheets

WET PROCESSING SYSTEM, WET PROCESSING METHOD AND STORAGE MEDIUM

BACKGROUND OF THE INVENTION

1. Field of the Invention

The present invention relates to a wet processing system for applying a process solution, such as a resist solution or a developer, by a process solution pouring nozzle to a substrate, such as a semiconductor wafer or a glass substrate for a liquid crystal display (LCD substrate), a wet processing method, and a storage medium storing a program specifying the wet processing method.

2. Description of the Related Art

A resist pattern forming process for forming a resist pattern on a substrate is one of the processes for fabricating a semiconductor device or a LCD substrate. The resist pattern forming process includes a series of steps of forming a resist film on a substrate, such as a semiconductor wafer (hereinafter, referred to simply as "wafer"), exposing the resist film through a photomask, and developing the exposed resist film to form a resist pattern. The series of steps is carried out by a coating and developing system.

The coating and developing system includes wet processing units including coating units for applying a resist solution to a wafer, and developing units for applying a developer to the wafer processed by an exposure process. The coating and developing system is provided with plural coating units and developing units to process wafers at a high throughput.

The coating unit for applying, for example, a resist solution, namely, a process solution, to a wafer has a spin chuck, namely, a substrate holding device, and a cup surrounding the spin chuck. A resist solution is poured onto a substantially central part of a wafer held by the spin chuck. The spin chuck is rotated for entirely coating the surface of the wafer with the resist solution by spin-coating and for drying the wafer by spin drying. The coating unit also carries out a side rinsing process.

The resist solution supplied from a resist solution supply unit is poured through a nozzle (process solution pouring nozzle) onto a wafer. In most cases, the nozzle is held at a home position apart from a wafer carrying passage while the nozzle is not in use to avoid obstructing a wafer carrying operation, and the nozzle is moved to a pouring position corresponding to the center of a wafer held by the spin chuck only when the resist solution needs to be poured onto the wafer.

The nozzle excluding its tip part needs to be filled up with the resist solution to start pouring the resist solution immediately after the nozzle has been moved to the pouring position above the wafer. Sometimes, the resist solution drips from the nozzle onto parts of the wafer other than a desired part while the nozzle is being moved to the pouring position when the nozzle is filled up with the resist solution. Consequently, a peripheral part, for instance, of the wafer is wetted with the resist solution. If the wafer is wetted with the resist solution for spin coating by pouring the resist solution through the nozzle positioned at the pouring position onto the wafer so wetted abnormally with the resist solution, a resist film of irregular thickness is formed to cause unsatisfactory exposure. If the spin chuck is wetted with the resist solution, the attraction of the spin chuck is reduced in some cases.

A suck-back valve provided with a suction chamber is placed in a resist solution supply line for carrying the resist solution to the nozzle to prevent the resist solution from dripping when the resist solution does not need to be poured. The vacuum chamber of the suck-back valve is expanded to create a vacuum to retract the end surface of the resist solution in the nozzle to prevent the resist solution from accidentally dripping from the nozzle. In some cases, the retracted end surface of the resist solution is forced to advance by the generation of bubbles by gases dissolved in the resist solution or the expansion of bubbles and the resist solution due to changes in the temperature of the cleanroom. Thus it has been difficult to prevent perfectly the drip of the resist solution onto positions other than a desired position Recent request for flexible manufacturing of many types of products in small quantities requires selectively using different kinds of resist solutions. It has been a usual method of changing the resist solutions to replace the nozzle held by a nozzle carrying arm for carrying the nozzle with another one. The inventors of the present invention developed a nozzle carrying arm fixedly holding plural nozzles to simplify a nozzle changing operation and to omit a nozzle changing mechanism. When the nozzle carrying arm holding, for example, ten nozzle is moved, the probability of dripping the resist solution is ten times the probability when a single nozzle is held by the nozzle carrying arm, and hence the importance of the drip preventing measures for preventing the drip of the resist solution increases still further.

Efforts have been made to use parts common to the same type of plural wet processing devices included in a coating and developing system to reduce the kinds of parts and to reduce weight. An example of one of such efforts is making studies to develop a coating unit including plural sets each of a spin chuck and a cup (hereinafter referred to as "wet processing devices") arranged in a line in one box, and one common nozzle arm holding one common nozzle and moving the common nozzle in the wet processing devices by a common nozzle carrying arm to pour a resist solution onto wafers held on the spin chucks. In this coating unit, the common nozzle needs to travel a long distance for a long time. Therefore, it is highly possible that the resist solution drips during the movement of the common nozzle. When a coating unit of this type is provided with a nozzle arm holding plural nozzles, the problem of dripping the resist solution is far more serious than a coating unit of a conventional type.

A monitoring technique using a camera for monitoring the condition of an end part of a nozzle is mentioned in JP-A No. H11-176734, Paragraphs 0017 to 0020 and JP-A 2003-136015, Paragraphs 0090 to 0102, FIG. 14. This monitoring technique is employed in the present invention. Image information about the end part of the nozzle is obtained by the camera while the resist solution is being poured onto a wafer or immediately before and immediately after pouring the resist solution. The image information is analyzed, and the output of a pump included in a resist solution supply unit and the quantity of operation of a suck-back valve are adjusted on the basis of results of analysis of the image information to supply the resist solution constantly or to supply the resist solution uniformly when the nozzles are changed.

Since the camera is installed so as to monitor the nozzle positioned above a substantially central part of the wafer, the camera is unable to monitor the condition of the end part of the nozzle while the nozzle is being carried. Nothing is mentioned in those cited references about techniques for dealing with the foregoing troubles.

SUMMARY OF THE INVENTION

The present invention has been made under such circumstances and it is therefore an object of the present invention to provide a wet processing system capable of obtaining an image of a globule of a process solution in a drippy state, in which a globule of a process solution is almost dripping from a coating liquid pouring nozzle, or in a dripping state, in which a globule of the process solution is dripping, while the process solution pouring nozzle is being moved to a pouring position at which the process solution is poured onto a substrate, and of properly dealing with such a state, a wet processing method to be carried out by the wet processing system, and a storage medium storing a program specifying the wet processing method.

A wet processing system according to the present invention for pouring a process solution supplied by a process solution supply unit through a process solution pouring nozzle onto a surface of a substrate held substantially horizontally by a substrate holding device surrounded by a cup to process the surface by a wet process includes: a nozzle bath for holding process solution pouring nozzles thereon at a home position; a nozzle carrying mechanism for carrying the process solution pouring nozzles between the home position on the nozzle bath and a position above the substrate held by the substrate holding device; an image pickup means for taking a picture of tips of the process solution pouring nozzles while the process solution pouring nozzles are being carried by the nozzle carrying mechanism; a decision means for deciding whether or not a globule of the process solution is in a drippy state or has dripped off the tip of the process solution pouring nozzle and in a dripping state on the basis of image data provided by the image pickup means; and a control means for making the process solution supply unit and/or the nozzle carrying mechanism execute a drip preventing operation to cope with a drippy state where a globule of the process solution is in a drippy or dripping state where the process solution is dripping when the decision means decides that the process solution is in the drippy or the dripping state.

In this specification, the term "drippy state" signifies a state where a globule of the process solution protrudes down from the tip of the process solution pouring nozzle, and the term "dripping state" signifies a state where the process solution has dripped off the tip of the process solution pouring nozzle.

The nozzle carrying mechanism may simultaneously carry the plural process solution pouring nozzles. The decision means may identifies each of the process solution pouring nozzles by image data provided by the image pickup means, and may decides whether or not a globule the process solution is in a drippy or dripping state on the basis of the image data.

Preferably, the control means stops making the process solution supply unit and/or the nozzle carrying mechanism execute the drip preventing operation, to cope with the drippy state where a globule of the process solution is drippy or the dripping state where a globule of the process solution is dripping, on the basis of the image data on the process solution pouring nozzle in a process solution pouring operation. Preferably, the image pickup means is combined with the nozzle carrying mechanism, the image pickup means is a camera provided, for example, with a CCD or a CMOS image sensor. Preferably, the wet processing system further include a light source for illuminating the process solution pouring nozzles when the image pickup means obtains an image of the process solution pouring nozzles. Preferably, the wet processing system further includes a first storage means storing reference information including a criterion for deciding whether or not a globule of the process solution is in a drippy state, and the decision means decides whether or not a globule of the process solution is in a high-level drippy state and determines the size of a globule of the process solution formed at the tip of the process solution pouring nozzle on the basis of results of comparison of the image data and the reference information. Preferably, the reference information and the image data are those relating to the curvature or the sectional area of the globule of the process solution in a drippy state.

Preferably, the wet processing system further includes a second storage means for storing image data obtained in the past. The decision means may compare the past image data obtained at a past time a predetermined period ago and the present image data obtained at the present, and may decide that a globule of the process solution has dripped when the size of a globule represented by the present image data is smaller than that of a globule represented by the past image data or when image data obtained at a position in an image pickup area at a predetermined distance below the tips of the process solution pouring nozzles indicates a part or the whole of a globule of the process solution. The process solution pouring nozzles may be made of a transparent material, and the decision means may further decide whether or not bubbles are found in the process solution in an end part of each of the process solution pouring nozzles on the basis of the image data provided by the image pickup means. The decision means may calculate the amount of a process solution poured through each of the process solution pouring nozzles on the basis of the thickness of a stream of the process solution poured through the process solution pouring nozzle and time for which the process solution is poured represented by the image data. The wet processing system may further include a suck back valve for retracting the process solution into the end part of each of the process solution pouring nozzles, and a coating operation control means that gives a process solution supply start signal to the process solution supply unit. The decision means may calculate a pouring speed at which the process solution is poured on the basis of a distance by which the process solution has been retracted behind the tip of the process solution pouring nozzle by the agency of the suck back valve, and time between a time the coating control means provided the process solution supply start signal and a time image data representing the process solution at the tip of the process solution pouring nozzle is obtained.

When the drip preventing operation for preventing the drip of the process solution includes the steps of returning the process solution pouring nozzles back to the nozzle bath, and discharging the process solution through each of the process solution pouring nozzle into the nozzle bath, the control means may execute the drip preventing operation after completing pouring the process solution onto a substrate held by the substrate holding device or may execute the drip preventing operation before starting pouring the process solution, when an image of the drip of the process solution is picked up during a nozzle carrying operation for carrying the process solution pouring nozzle to the pouring position to pour the process solution onto the surface of the substrate. The drip preventing operation may stop carrying a succeeding substrate into the wet processing system.

Preferably, the wet processing system further includes a warning means for giving a warning to the effect that a globule of the process solution is in a drippy or dripping state when it is decided that a globule of the process solution is in a drippy or dripping state. The wet processing system may include counters respectively combined with the process solution pouring nozzles to count the frequencies drippy or dripping globules of the process solution occurred in the process solution pouring nozzles. The warning means may give a warning to the effect that the process solution is drippy or dripping when the frequency of drippy or dripping globules occurred in any one of the process solution pouring nozzles is greater than a predetermined frequency.

The wet processing system having those distinctive features is suitably applicable to a wet processing system in which the plural wet processing devices each having the cup and the substrate holding device are arranged laterally in a line in a common box, and the plural wet processing devices share the process solution pouring nozzles and the nozzle carrying mechanism. Preferably, this wet processing system further includes, in addition to the nozzle bath to which the process solution pouring nozzles are returned to discharge the process solutions into the nozzle bath, intermediate baths disposed each between the adjacent ones of the wet processing devices arranged in the box to move the process solution pouring nozzles thereto and to make the process solution pouring nozzles execute the drip preventing operation thereon.

A wet processing method of processing a surface of a substrate held substantially horizontally by a substrate holding device surrounded by a cup by pouring process solutions supplied by a process solution supply unit through process solution pouring nozzles onto the substrate according to the present invention includes the steps of: holding the process solution pouring nozzles on a nozzle bath; carrying the process solution pouring nozzles between the nozzle bath and a pouring position above the substrate held by the substrate holding device; obtaining image data on tips of the process solution pouring nozzles while the process solution pouring nozzles are being carried in the step of carrying the process solution pouring nozzle; deciding whether or not a globule of the process solution is in a drippy or dripping state on the basis of image data obtained in the step of obtaining image data; and making the process solution supply unit and/or the nozzle carrying mechanism execute a drip preventing operation when it is decided that a globule of the process solution is in a drippy or dripping state.

The plural process solution pouring nozzles may be simultaneously carried in the step of carrying the process solution pouring nozzles, and the process solution pouring nozzles may be identified by and a decision whether or not a globule of the process solution is in a drippy or dripping state may be made on the basis of image data obtain in the step of obtaining image data. It is preferable not to execute the drip preventing operation in the step of executing the drip preventing operation in response to a decision made on the basis of the image data on the process solution pouring nozzle in a pouring operation for pouring the process solution onto a surface of the substrate. In the step of obtaining image data, it is preferable to form an optical image of tips of the process solution pouring nozzles by a camera provided with an image sensor. Preferably the wet processing method further includes a step of illuminating the process solution pouring nozzles in the step of obtaining optical data on the process solution pouring nozzles.

The wet processing method may further include a step of storing reference information as a criterion on which a decision of occurrence of a globule in a drippy state is made. The step of deciding whether or not a globule of the process solution is in a drippy state or a globule of the process solution is in a dripping state may decide whether or not globule of the process solution is dripping from the tip of the process solution pouring nozzle on the basis of results of comparison of the image data and the reference information. Preferably, the reference information and the image data are those relating to the curvature or the area of the nearly dripping globule of the process solution.

The wet processing method may further include the step of storing image data obtained in the past. The step of deciding whether or not a globule of the process solution is in a drippy or dripping state may compare the past image data obtained at a past time a predetermined period ago and the present image data obtained at the present, and may decide that a globule of the process solution is in a dripping state when the size of a globule represented by the present image data is smaller than that of a globule represented by the past image data or when image data obtained in an image pickup area at a predetermined distance below the tips of the process solution pouring nozzles indicates a part or the whole of a globule of the process solution.

The drip preventing operation may include, for example, the steps of returning the process solution pouring nozzles back to the nozzle bath, and discharging the process solutions through the process solution pouring nozzles into the nozzle bath. The drip preventing operation may be executed after completing pouring the process solution onto a substrate held by the substrate holding device or may be executed before the process solution is poured onto the substrate when an image of the drip of the process solution is picked up during a nozzle carrying operation for carrying the process solution pouring nozzle to the pouring position to pour the process solution onto the surface of the substrate. The drip preventing operation may be an operation for stopping carrying a succeeding substrate into the wet processing system.

Preferably, the wet processing method further includes the step of giving a warning to the effect that a globule of the process solution is in a drippy or dripping state when it is decided that a globule of the process solution is in a drippy or dripping state. The wet processing method may further include the step of counting the frequencies of globules in a drippy state occurred in each of the process solution pouring nozzles.

A warning may be given to the effect that a globule of the process solution is in a drippy or dripping state when the frequency of globules in a drippy state occurred in any one of the process solution pouring nozzles is greater than a predetermined frequency.

The present invention provides a storage medium storing a program to be executed by a wet processing system for pouring process solutions supplied by a process solution supply unit respectively through process solution pouring nozzles onto a surface of a substrate held substantially horizontally by a substrate holding device surrounded by a cup to process the surface by a wet process, wherein the program specifies the steps of any one of the foregoing wet processing methods.

According to the present invention, the image pickup means obtains an optical image of tips of the process solution pouring nozzles while the process solution pouring nozzles are being carried by the nozzle carrying mechanism. Thus a drippy state where a globule of the process solution is drippy or a dripping state where a globule of the process solution is dripping can be known while the process solution pouring nozzles are being carried. Therefore the drip preventing operation can be carried out properly. For example, the process solution pouring nozzles are returned to the nozzle bath and the process solution pouring nozzles are operated for a dummy pouring operation if a globule of the process solution is in a drippy state or carrying a succeeding substrate into the wet processing system can be stopped if a globule of the process solution has dripped. Thus the production of defective products can be prevented and the yield can be improved by preventing the drip of the process solution at positions other than the pouring position. If the drip of the process solution could not be prevented, proper measures, such as wiping off the process solution dripped onto the substrate can be taken immediately after automatically stopping the wet

DESCRIPTION OF THE PREFERRED EMBODIMENTS

Figure 1:
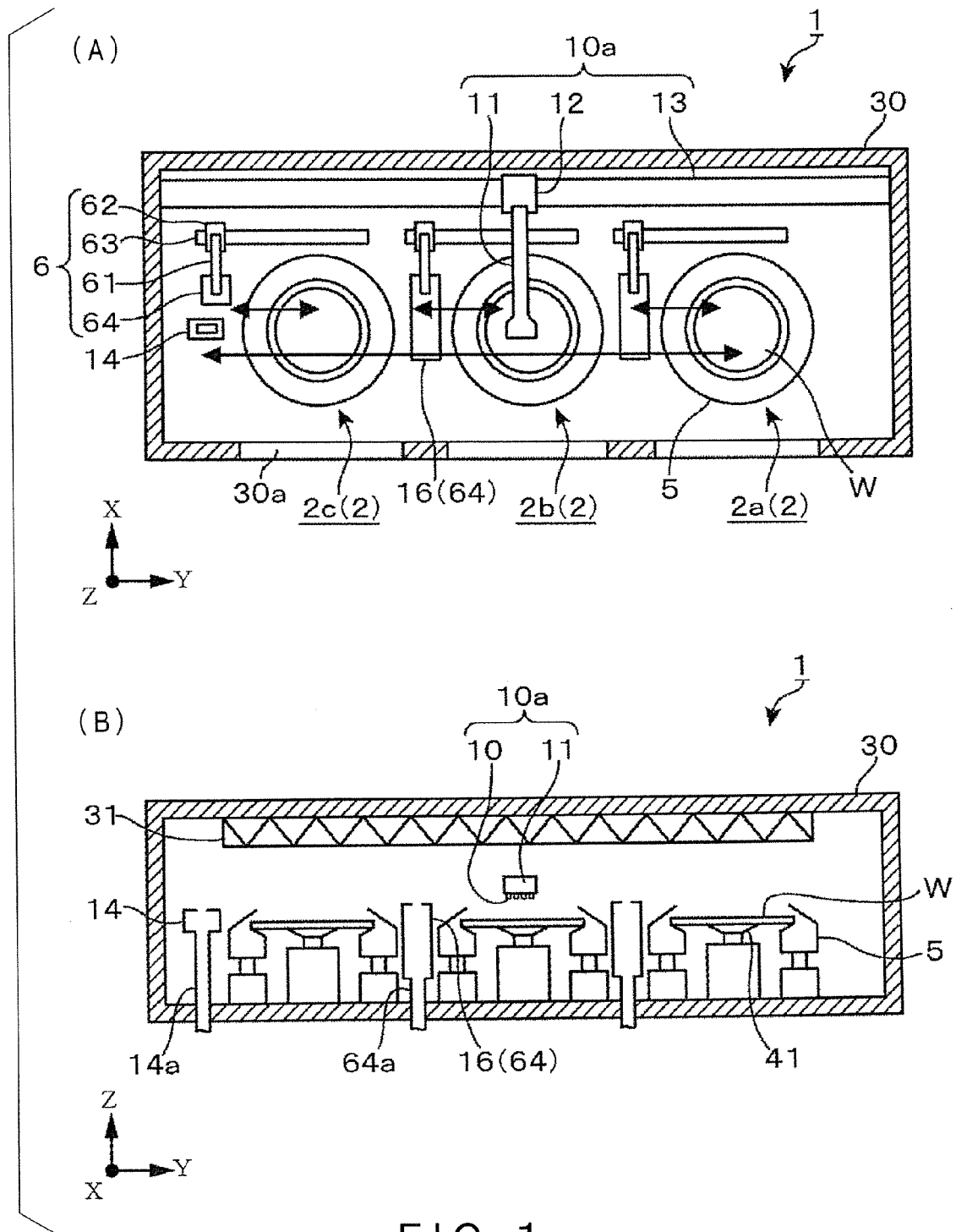
FIGS. 1A and 1B are a plan view and a sectional view, respectively, of a coating unit according to the present invention.
Figure 2:
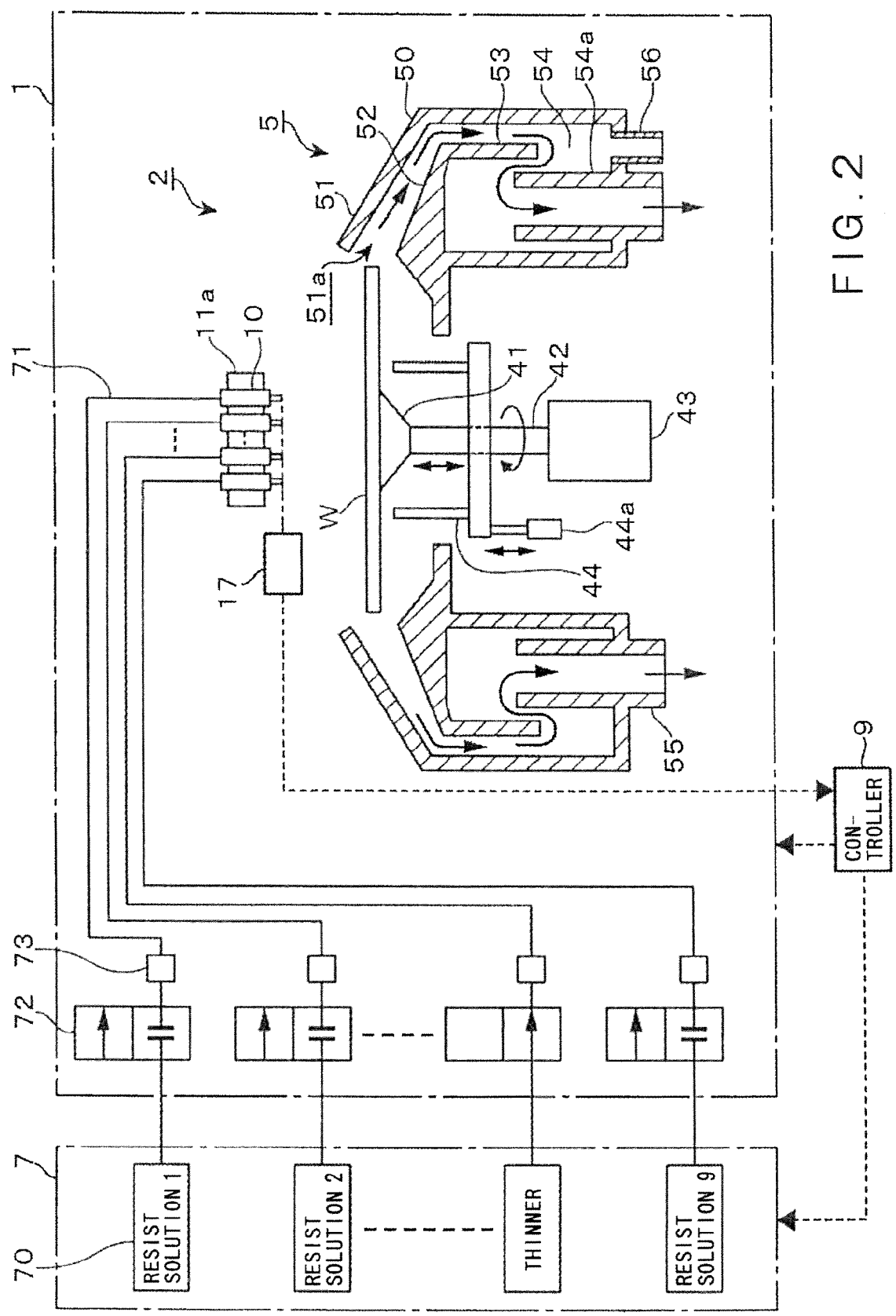
FIG. 2 is a typical sectional view of a wet processing device included in the coating unit, and a block diagram of a process solution supply unit.

A coating unit for applying a resist solution to a wafer will be described as a preferred embodiment of a wet processing system according to the present invention. First, the construction of the coating unit will be described. FIGS. 1A and 1B are a schematic plan view and a longitudinal sectional view, respectively, of the coating unit 1, and FIG. 2 is a typical sectional view of a wet processing device 2 included in the coating unit 1, and a block diagram of a process solution supply system 7 for supplying the resist solutions to the wet processing devices 2.

Referring to FIGS. 1A and 1B, the coating unit 1 has a three wet processing devices 2a, 2b and 2c arranged in a line parallel to the Y direction in a flat box 30, plural process solution pouring nozzles (hereinafter, referred to simply as "nozzles") 10 for pouring a resist solution, a solvent and such in the wet processing devices 2a, 2b and 2c (inclusively designated by 2 in some cases), a nozzle carrying mechanism 10a for carrying the nozzles 10, a nozzle bath 14 for holding the nozzles 10 at a home position, and an edge bead remover (EBR) mechanism 6.

The wet processing devices 2 are the same in construction. Each of the wet processing devices 2 has a spin chuck 41, namely, a substrate holding device, and a cup 5 capable of surrounding a wafer W held by the spin chuck 41. The wet processing device 2 will be described.

The spin chuck 41 is a substrate holding device capable of holding a wafer W in a horizontal position by attracting a central part of the back surface of the wafer W thereto. As shown in FIG. 2, the spin chuck 41 is joined to the upper end of a shaft 42. The shaft 42 is connected to a driving mechanism (spin chuck motor) 43. The spin chuck 41 holding a wafer W can be moved vertically and can be rotated. Lifting pins 44 connected to a lifting mechanism 44a are arranged around the spin chuck 41. The lifting mechanism 44a moves the lifting pins 44 vertically to move a wafer W vertically. The lifting pins 44 and a carrying arm A3 cooperate to transfer a wafer W carried into the box 30 between the lifting pins 44 and the carrying arm A3. As shown in FIG. 1A, the box 30 is provided with openings 30a. A wafer W is carried into and carried out of the box 30 through each of the openings 30a.

The cup 5 catches droplets scattered by a wafer W rotated for a spin coating process or the like to prevent the droplets from being scattered outside the coating unit 1. The cup 5 has a substantially annular appearance. The construction of the cup 5 is shown in FIG. 2.

The construction of the cup 5 will be described with reference to FIG. 2. The cup has a first annular member 51 having a tapered shape, and a second annular member 52. A gas passage 51a is formed between the annular members 51 and 52. A gas containing droplets scattered by the wafer W flows through the gas passage 51a. The second annular member 52 is disposed under a peripheral part of a wafer W held by the spin chuck 41. The second annular member 52 has a top surface of a sectional shape resembling an inverted letter V. The second annular member 52 has an outer side wall 53 extending into a drain sump 54 formed in a bottom part of the cup 50. Part of a resist solution scattered by the wafer W flows along the outer surface of the outer side wall 53 of the second annular member 52 into the drain sump 54.

The sump 54 is formed in the bottom part of the cup 50. The bottom part of the cup 50 is provided with, for example, two discharge ports 55 through which gases flowed into the cup 5 is discharged, and a drain port 56 through which the resist solution connected in the drain sup 54 is drained. The discharge ports 55 of the wet processing devices 2a, 2b and 2c are connected to a duct, not shown, connected to an exhaust system outside the box 30.

As shown in FIG. 2, a wall defining each of the discharge ports 55 extends upward in the drain sump 54 and serves as an overflow preventing wall 54a for preventing the drain collected in the drain sump 54 from flowing into the discharge port 55. A drain line, not shown, is connected to the drain port 56 to discharge the drain outside the coating unit 1.

Referring to FIG. 1B, a filter unit 31 is held on the top wall, facing the cups 5, of the box 30. The filter unit 31 supplies clean air in a downward laminar airflow at a predetermined flow rate into the box 30. Part of the clean air is discharged by a discharge unit, not shown, installed in the box 30, and the rest of the clean air flows into the cup 5. The clean air flows in air currents indicated by the arrows in FIG. 2 and is discharged through the discharge ports 55.

Figure 3:
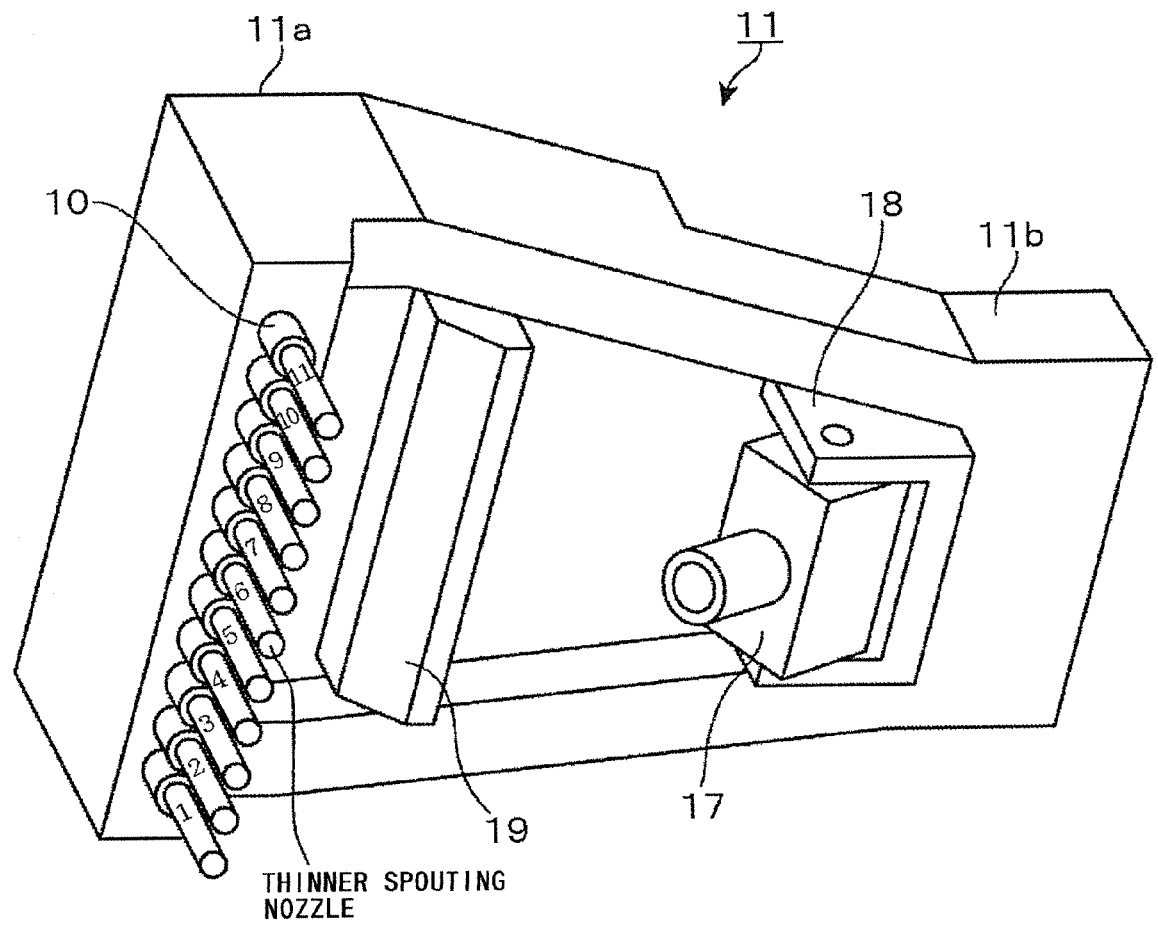
FIG. 3 is a perspective view of a nozzle arm and process solution pouring nozzles mounted on the nozzle arm.

The nozzles 10 and the nozzle carrying mechanism 10a will be described. A resist solution is poured through each nozzle 10 onto the surface of a wafer W held by the spin chuck 41. FIG. 3 is a perspective view of the nozzles 10, and a nozzle arm 11 holding the nozzles 10. The number of the nozzles 10 for the coating unit 1 in this embodiment is, for example, eleven. The ten nozzles 10 are used for pouring ten kinds of resist solutions respectively having different concentrations and different compositions, respectively. The one nozzle 10 is used for pouring a thinner for promoting the spread of the resist solution on a wafer W. Those resist solution and the thinner will be inclusively referred to as "process solutions".

As shown in FIG. 3 each nozzle 10 has a tubular shape. Base parts of the nozzles 10 can be attached to a nozzle head 11a of the nozzle arm 11. The process solution supplied through the nozzle arm 11 flows through the nozzle 10 and is poured through the tip of the nozzle 10 onto a wafer W. In FIGS. 1A and 2, some of the nozzles 10 are omitted.

Referring to FIG. 1A, the nozzle carrying mechanism 10a includes the nozzle arm 11 holding the nozzles 10, a base 12 holding the nozzle arm 11, a rail 13 along which the base 12 travels, and a moving mechanism for moving the base 12 along the rail 13.

As shown in FIG. 3, the nozzle arm 11 has the nozzle head 11a holding the eleven nozzles 10, and an arm 11b supporting the nozzle head 11a. Openings are formed in the lower surface of the nozzle head 11a to receive the base parts of the nozzles 10. The nozzles 10 can be held on the nozzle head 11a simply by fitting the base parts of the nozzles 10 in the openings, respectively. The eleven nozzles 10 are attached to the nozzle head 11a with their tips directed down and are arranged in a line parallel to nozzle moving directions, indicated in FIG. 1A, in which the nozzles 10 are moved. Process solution supply pipes 71 of the process solution supply system 7 are connected to a part, on the side of the base 12, of the nozzle head 11a. Process solutions flows through passages formed in the nozzle head 11a to the nozzles 10, respectively.

The arm 11b is a support member extends between the nozzle head 11a and the base 12 to position the nozzles 10 at a position above a substantially central part of a wafer W held by the spin chuck 41. The base 12 is a slider that slides along the rail 13 to move the arm 11. The base 12 is provided with a lifting mechanism, not shown, and the base part of the arm 11b is connected to the lifting mechanism. The nozzle arm 11 can be moved in vertical directions parallel to the Z direction indicated in FIG. 1B. The rail 13 is extended on one side of the wet processing devices 2a, 2b and 2c parallel to a direction in which the wet processing devices 2a, 2b and 2c are arranged. The coating unit 1 is provided with the nozzle bath 14. The nozzles 10 are held on the nozzle bath 14 when not in use. The rail 13 has a length sufficient to move the base 12 between a position where the nozzles 10 are held on the nozzle bath 14 and a position where the nozzles 10 are positioned to pour the process solution onto a wafer W held in the wet processing devices 2a farthest from the nozzle bath 14. An atmosphere of a thinner is created in the nozzle bath 14 to prevent the process solutions in the nozzles 10 from being dried while the nozzles 10 are head at a home position on the nozzle bath 14.

The moving mechanism for moving the base 12 includes, for example, wrapping shafts arranged along the rail 13, a belt wound round the wrapping shafts and fastened to the base 12, and a driving device 15 (FIG. 4), such as a motor, connected to one of the wrapping shafts. The base 12 can be moved to a desired position by rotating the wrapping shafts by a desired number of turns in a desired direction.

The nozzles 10 can be moved along a straight line passing the nozzle bath 14 and the substantially central parts of the wet processing devices 2a, 2b and 2c by moving the base 12 along the rail 12. The nozzle 10 for pouring a desired process solution can be moved to a position above a substantially central part of a wafer W held in any one of the processing devices 2a, 2b and 2c to pour the desired process solution onto the wafer W by stopping the base 12 at a proper position on the rail 13.

The EBR mechanism 6 will be described. The EBR mechanism 6 removes a part of a resist film formed on a wafer W from a peripheral part of the wafer W by wetting the peripheral part of the wafer W with a rinsing liquid to prevent the separation of the peripheral part of the resist film from the wafer W. The EBR mechanisms 6 installed in the wet processing devices 2 are the same in construction. Referring to FIG. 1A, the EBR mechanism 6 includes an EBR arm 61 holding a rinsing liquid pouring nozzle for pouring the rinsing liquid, a base 62 holding the EBR arm 61, a rail 63 along which the base 62 travels, and an EBR nozzle bath 64 for holding the rinsing liquid pouring nozzle at a home position when the rinsing liquid pouring nozzle is not in use.

The EBR arm 61 resembles the nozzle arm 11 and is smaller than the nozzle arm 11. The EBR arm 61 is extended horizontally. A rinsing liquid pouring nozzle, not shown, is held on an end part of the EBR arm 61 such that the rinsing liquid pouring nozzle can pour the rinsing liquid onto a peripheral part of a wafer W held by the spin chuck 41. The base 62 is a slider that can be moved along the rail 63 by a belt, not shown, to move the EBR arm 61. The rail 63 is extended in a space between the nozzle carrying mechanism 10a and the corresponding one of the wet processing devices 2a, 2b and 2c substantially parallel to the rail 13 of the nozzle carrying mechanism 10a. The rail 63 has a length sufficient to move the base 62 between a position where the rinsing liquid pouring nozzles is held on the EBR nozzle bath 64 and a position where the rinsing liquid pouring nozzle is positioned to pour the rinsing liquid onto a wafer W held in the corresponding wet processing device 2.

The driving mechanism moves the EBR arm 61 to move the rinsing liquid pouring nozzle from the EBR nozzle bath 64 to a pouring position corresponding to a peripheral part of the wafer W. The EBR nozzle baths 64 installed in the wet processing devices 2b and 2c serve also as intermediate baths 16 on which the nozzles 10 can be held. Therefore, each of the EBR nozzle baths 64 is formed in a box having an elongate inlet to receive the process solutions discharged through the nozzles 10 as shown in FIG. 1A. An atmosphere of a thinner is created in each of the EBR nozzle baths 64. The use of the EBR nozzle baths 64 also as the intermediate baths 16 enables the use of a common thinner supply system and a common discharge system to simplify the construction of the coating unit 1.

The process solution supply system 7 for supplying the process solutions to the nozzles 10 will be described with reference to FIG. 2. The process solution supply system 7 has process solution supply mechanisms (process solution supply units) 70 respectively for supplying the process solutions. Each of the process solution supply mechanisms 70 includes a supply tank, not shown, storing, for example, the process solution, a pressurizing device for applying gas pressure to the process solution stored in the supply tanks to send the process solution to the coating unit 1.

Each process solution supply mechanism 70 is connected to the nozzle 10 through an air-operated valve 72 for selectively supplying or stopping supplying the process solution, a suck back valve 73 for pulling the process solution back into the end part of the nozzle 10, and a supply line 71. Thus the process solution supply system 7 can selectively supply the ten kinds of process solutions and the thinner. In FIG. 2, the process solution supply mechanism 70 for supplying the thinner is connected to the second nozzle 10 from the left facing the paper for the convenience of illustration. Actually, the process solution supply mechanism 70 for supplying the thinner is connected to the sixth nozzle 10 from the left facing the paper as shown in FIG. 3. The nozzles 10 are thus connected to the process solution supply mechanisms 70 to reduce the mean moving distance of moving distances for which the base 12 needs to be moved to position the nozzle 10 for pouring the thinner before the process solution is poured and the nozzle 10 for pouring the process solution after the thinner has been poured in that order at the position corresponding to the center of the wafer W to a minimum.

As shown in FIG. 2, the coating unit 1 and the process solution supply system 7 are connected to a controller 9 for governing and controlling the operations of the devices. The controller 9 is also capable of governing and controlling the operations of a coating and developing system including the coating unit 1 embodying the present invention.

An operation of the coating unit 1 for applying a resist solution to a wafer W will be briefly described. A wafer W is carried by an external carrying device through one of the three openings 30a into the box 30 and is placed on the lifting pins 44. Then, the external carrying device is moved out of the box 30 and the lifting pins 44 are lowered to transfer the wafer W to the spin chuck 41 of the wet processing device 2 corresponding to the opening 30a through which the wafer W was carried into the box 30.

Subsequently, the nozzle carrying mechanism 10 is actuated. The nozzle arm 11 is raised to lift up the nozzles 10 held on the nozzle bath 14 and is moved in a Y direction shown in FIG. 1A. The nozzle arm 11 is stopped upon the arrival of the nozzle 10 for pouring the thinner at a pouring position above a substantially central part of the wafer W, and then the nozzle arm 11 is lowered. After the thinner has been poured through the nozzle 10 onto the stationary wafer W, the nozzle arm 11 is moved to position the nozzle 10 for pouring the resist solution at a pouring position above a substantially central part of the wafer W. At the same time, the spin chuck 41 is rotated, for example, at a high rotating speed, the resist solution is poured onto the rotating wafer W and the pouring of the resist solution is stopped. Thus the resist solution is spread radially to achieve spin coating.

Then, the spin chuck 41 is rotated at a low rotating speed to make the thickness of a resist film formed on the wafer W by spin coating uniform. Subsequently, the spin chuck 41 is rotated at a high rotating speed to dry the resist film by spin drying. While the resist film is being dried by spin drying, the nozzle carrying mechanism 10a reverses the nozzle arm 11 to place the nozzles 10 on the nozzle bath 14.

After the spin drying of the resist film has been completed, the relevant EBR mechanism 6 moves the rinsing liquid pouring nozzle from the EBR nozzle bath 64 to a position corresponding to a peripheral part of the wafer W. The rinsing liquid is poured onto the peripheral part of the wafer W, the spin chuck 41 is rotated to remove a part, formed on the peripheral part of the wafer W, of the resist film, and the wafer W wetted with the rinsing liquid is dried by spin drying to complete the series of steps of the wet process.

After the rinsing liquid pouring nozzle has been returned to the EBR nozzle bath 64, the wafer W coated with the resist film is transferred to the external carrying device by reversing the steps of transferring the wafer W to the spin chuck 41. Then, the external carrying device carries out the wafer W from the coating unit 1. Wafers W are carried sequentially to each of the wet processing devices 2 at intervals of, for example, 24 s according to a predetermined wafer carrying cycle specified for the coating and developing system, and the wafers W are subjected to the same processes. After the process solutions, namely, the resist solution and the thinner, have been poured on to the wafer in each of the wet processing devices 2, the nozzles 10 are returned to the nozzle bath 14 disposed, for example, at one end of the coating unit 1 to prevent the resist solution remaining in the nozzles 10 from drying.

The coating unit 1 has functions to cope with the occurrence of a globule DP in a drippy state at the tip of the nozzle or in a dripping state where a globule DP of the process solution has dripped off the tip of the nozzle 10 while the nozzle 10 is being moved from the nozzle bath 14 to the pouring position by obtaining optical data on the condition of the process solution in the nozzle 10 and taking measures to cope with such a state on the basis of the optical data. Those functions will be described.

The term "a drippy state" signifies a state where a globule of the process solution protrudes down from the tip of the process solution pouring nozzle 10, and the term "dripping state" signifies a state where a globule of the process solution has dripped off the tip of the process solution pouring nozzle 10.

The function to obtain an optical image of a globule DP of the process solution in a drippy state or in a dripping state will be described. Referring to FIG. 3, a camera 17, such as a CCD camera, namely, an image pickup means for obtaining an image of the nozzles 10 held on the nozzle head 11a, is fixed to the nozzle arm 11 of the nozzle carrying mechanism 10a by a fixing member 18. As shown in FIG. 3, the camera 17 obtains an optical image of the nozzles 10 from a direction substantially perpendicular to a direction in which the nozzles 10 are arranged on the nozzle head 11a so that any one of the nozzles 10 may not be blinded by other nozzles 10 from the camera 17. The camera is provided, for example, a wide-angle lens so that the tips of all the nozzles 10 arranged in a line are in its image range and the camera 17 can be focused on the tips of the nozzles 10. The image pickup means may be provided with any suitable image sensor other than the CCD, such as a CMOS image sensor.

A light source 19 for illuminating the nozzles 10 is disposed between the camera 17 and the nozzles 10 attached to the lower surface of the nozzle head 11a. The light source 19 is provided with a lamp that emits visible light of a comparatively long wavelength, such as yellow, orange or red light, such as a LED lamp. The light source 199 is required to emit light to which the resist solution to be poured is not sensitive.

As shown in FIG. 2, the camera1 17 is connected through an A/D converter, not shown, to the controller 9. The controller decides on the basis of image data provided by the camera 17 whether or not a globule of the process solution is in the drippy or the dripping state. The controller 9 has a function to make the nozzle carrying mechanism 10a and such take measures on the basis of the result of a decision. This function will be described below.

Figure 4:
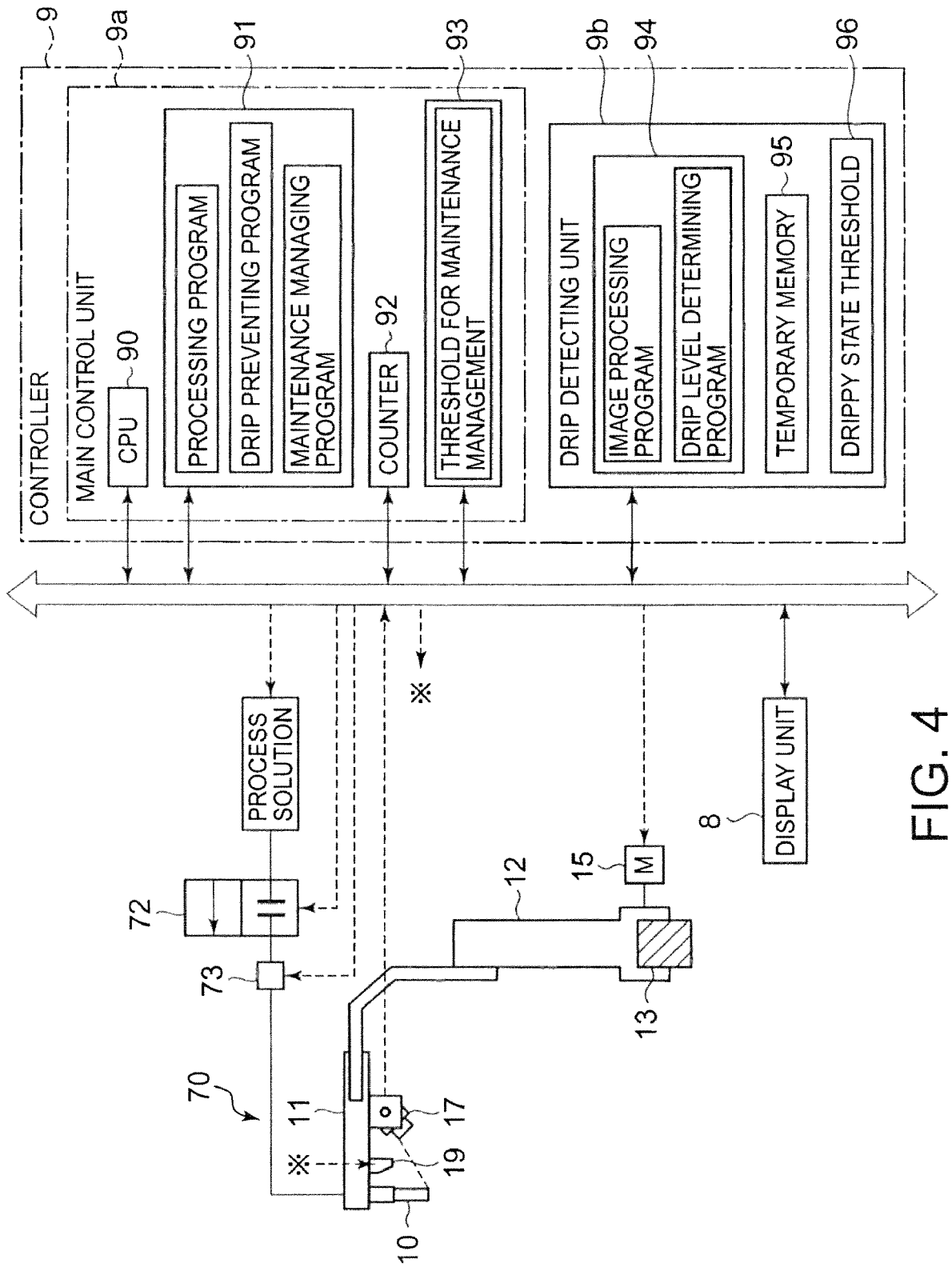
FIG. 4 is a block diagram of an electrical system included in the coating unit.

FIG. 4 is a block diagram of assistance in explaining the relation between the coating unit 1, the devices of the process solution supply system 7, and the controller 9. For example, the controller 9 includes a main control unit 9a for governing and controlling the coating and developing system including the coating unit 1 embodying the present invention, and a drip detecting unit 9b for carrying out image processing operations necessary for deciding whether or not the drippy or the dripping state has occurred, and deciding whether or not the drippy or the dripping state has occurred on the basis of the result of the image processing operations.

The main control unit 9a is a computer including a central processing unit (CPU) 90 and a program storage device 91. The program storage device 91 stores computer programs. As shown in FIG. 4, the computer programs are a drip preventing program specifying steps for the computer to execute to make the devices of the coating unit 1 and the process solution supply system 7 execute drip preventing operations for coping with the drippy state or the dripping state when the drip detecting unit 9b decides that a globule of the process solution is in a drippy or dripping state, and a maintenance management program specifying steps of maintenance management.

The program storage device 91 includes a storage means, such as a hard disk, a compact disk, a magnetooptical disk or a memory card.

The main control unit 9a also includes a counter 92 and a set value storage device 93. The counter 92 counts the frequency of globules DP in a drippy state occurred in each of the nozzles 10. The set value storage device 93 stores a maintenance management threshold, namely, a reference with which the counted frequency is compared to decide whether or not the maintenance of the nozzle 10 is necessary. The counter 92 is, of example, a rewritable flash memory. The set value storage device 93 is, for example, a part of the hard disk of the program storage device 91.

The drip detecting unit 9b is, for example, a microcomputer including a CPU, not shown, and a program storage device 94. The program storage device 94 is, for example, a ROM and RAM. The drip detecting unit 9b stores computer programs specifying the steps of obtaining the image obtained by processing image data provided by the camera 17 and necessary for deciding whether or not the drippy or the dripping state has occurred, and steps of deciding whether or not the drippy or the dripping state has occurred on the basis of the image. As shown in FIG. 4, the computer programs are an image processing program and a drip detecting program.

The drip detecting unit includes also a temporary memory 95 for temporarily storing images obtained in the past for detecting the drip of the process solution, and a set value storage device 96 for storing a drippy state threshold for deciding whether or not a globule is in a drippy or dripping state. The temporary memory 95 is, for example, a rewritable flash memory. The set value storage device 96 is, for example, a part of the ROM serving as the program storage device 94.

The main control unit 9a is connected to the camera 17, the driving mechanism 15 of the nozzle carrying mechanism 10a, the process solution supply mechanisms 70, the air-operated valve 72 and the suck back valve 73. The main control unit 9a controls those components on the basis of the result of a decision as to whether or not a globule in the drippy or the dripping state has occurred to make those components execute the predetermined drip preventing operations. A power source for the light source 19 for illuminating the nozzles 10 is connected to the main control unit 9a. The main control unit 9a turns on the light source 19 to illuminate the nozzles 10 intermittently in synchronism with the image pickup operation of the camera 17. Thus the light source 91 is not continuously energized to reduce the effect of accumulated heat generated by the light source 19 on the processes.

The controller 9 is connected also to a display unit 8. The display unit 8 displays various pieces of information for the user according to instruction provided by the main control unit 9a.

Figure 5:
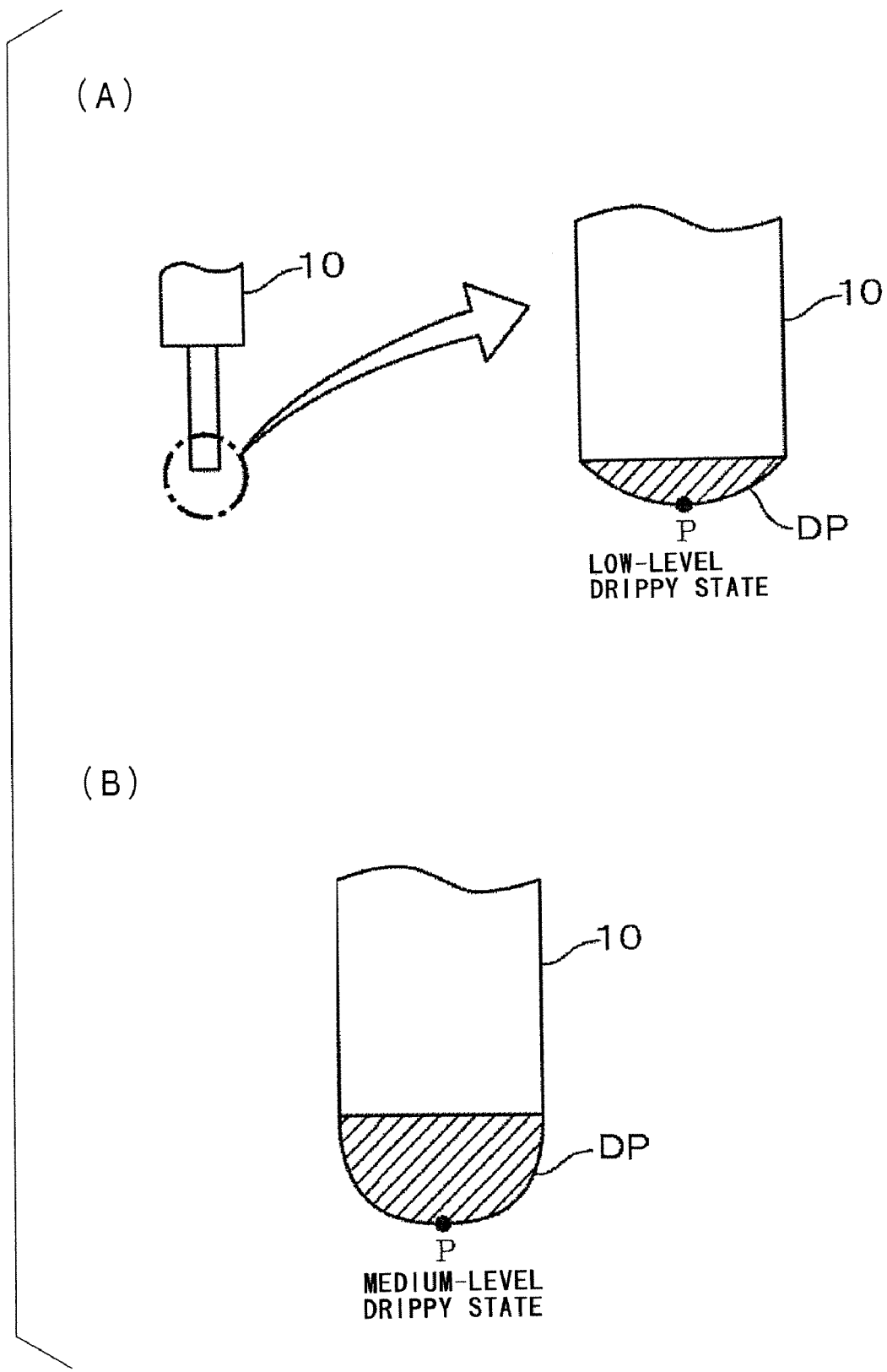
FIGS. 5A and 5B are typical views of assistance in explaining a drippy state where a globule of a process solution at the tip of a process solution pouring nozzle is in a drippy state.

Operations to be executed by the drip detecting unit 9b for processing the image data and making a decision on the basis of the image obtained by processing the image data will be described. FIGS. 5A and 5B are typical views of assistance in explaining a drippy state where a globule of the process solution at the tip of the nozzle 10 is almost dripping. In FIGS. 5A and 5B, a globule of the process solution is indicated at DP. The globule DP is in a low-level drippy state in FIG. 5A and the globule DP is in a high-level drippy state in FIG. 5B.

The drip detecting unit 9b obtains image data by the camera 17 at intervals of, for example, 200 ms. The image data is obtained by converting an analog image obtained by the camera 17 into an 8-bit digital signal of a predetermined resolution capable of representing an image of a gradation of, for example 256 steps. A boundary between a globule DP and a space surrounding the globule DP, namely, the contour of the globule DP, is determined, for example, on the basis of the difference in gradation between the globule DP and the space. The contour of the globule DP is displayed on a screen. Surface tension of the globule DP makes the globule DP assume a part of a sphere. Therefore, the globule DP has a profile of a circular arc as shown in FIG. 5A or 5B.

The drip detecting unit 9b calculates the curvature C of a lower end P of the globule DP and decides the level of a drippy state from the curvature C. The globule DP shown in FIG. 5A is determined to be in a low-level drippy state when the calculated curvature C is small. The globule DP shown in FIG. 5B is determined to be in a high-level drippy state when the calculated curvature C is large. A reference information including thresholds for deciding whether or not a globule DP is in a high-level drippy state is stored beforehand in the set value storage device 96. The drip detecting unit 9b decides whether or not the globule DP is in a high-level drippy state by comparing the calculated curvature C obtained by processing the image data provided by the camera 17 with the threshold.

The thresholds stored in the set value storage device 96 are a first curvature $C_1$ and a second curvature $C_2$ greater than the first curvature $C_1$ ($C_1<C_2$). It is decide that a globule of the process solution is not in a drippy state when $C<C_1$. It is decided that a globule of the process solution is slightly drippy, i.e., in a low-level drippy state, when $C_1<C<C_2$. It is decided that a globule of the process solution is greatly drippy, i.e., the globule DP is in a high-level drippy state, when $C_2>C$, i.e.

When an image obtained by the camera 17 provided with the wide-angle lens is distorted, the drip detecting unit 9b may calculate the curvature C after processing the image by a distortion correcting process or the thresholds $C_1$ and $C_2$ may be determined counting on possible distortion. A calculated radius-of-curvature R ($=1/C$) may be used instead of the curvature for deciding whether or not a globule DP is in a high-level drippy state. The smaller the radius of curvature, the higher is the level of a drippy state.

The level of a drippy state does not necessarily need to be decided by the foregoing method. For example, a decision may be made as to whether or not a globule is in a high-level drippy state by comparing the area of an image of a globule DP projected on a plane corresponding to the number of pixels in an area defined by the contour of the globule DP corresponding the boundary between the globule and a space surrounding the globule determined on the basis of the tone of an image formed by the camera 17 with thresholds, namely, reference information, stored beforehand in the set value storage device 96.

The nozzle arm 11 of the nozzle carrying mechanism 10a holds the plural nozzles 10. Therefore, it is necessary to discriminate the nozzles 10 having a globule in a drippy state from the others. Those nozzles 10 having a globule in a drippy state may be discriminated from the others, for example, by a discriminating method that develops the image data on an XY coordinate system, and identifies the nozzles 10 having a globule in a drippy state by the respective positions of globules in a drippy state. The nozzles 10 may be previously marked with identification marks, such as nozzle numbers as shown in FIG. 3, and the nozzles 10 having a globule in a drippy state may be determined by matching the images of the identification marks included in the image obtained by the camera 17 with image data on the identification marks registered beforehand in the set value storage device 96.

When it is decided that the nozzle 10 has a globule in a drippy state through the foregoing procedure, the drip detecting unit 9b gives information identifying the level of the drippy state, which indicates whether or not a globule DP is in a high-level drippy state, and information identifying the nozzle 10 in the drippy state to the main control unit 9a.

A method of deciding the occurrence of a globule in a dripping state will be described. The drip detecting unit 9b stores the image data in time series in the temporary memory 95. For example, the drip detecting unit 9b decides that the process solution has dripped when the size of a globule represented by the present image data is smaller than that of a globule represented by the past image data obtained in the preceding image data obtaining cycle. The method of deciding the occurrence of a globule DP in a dripping state, similarly to the method of deciding whether or not a globule DP is in a high-level drippy state, uses the curvature of a globule determined by processing the image data. For example, a curvature $C_p$ at a past time written to the temporary memory 95 every 200 ms in an overwrite mode and a new curvature C at the present, decides that a globule DP has dripped when the difference $\Delta C$ (=$C_p$–C) is not smaller than a predetermined threshold, and gives information to that effect together with information about the nozzle 10 from which the globule DP has dripped to the main control unit 9a.

In some cases, a state where the difference $\Delta C$ is not smaller than the threshold occurs also due to the operation of the suck back valve 73 or temperature variation in the cleanroom. The variation of the operating mode of the suck back valve 73 and the temperature variation in the cleanroom may be monitored and it may be decided that the drip of the globule DP was not caused by the increase of the difference $\Delta C$ when the curvature was caused to change by the variation of the operating mode of the suck back valve 73 or the temperature variation in the cleanroom.

The image data on which the a decision as to whether or not the globule DP has dripped is not limited to the curvature of the globule DP and the area of an image of the globule DP projected on a plane may be used as the image data. The drip of the globule DP does not necessarily decided by the foregoing method. For example, it may be decided that dripping occurred when the image data provided by the camera 17 includes data on an image of a globule separated from the tip of the nozzle 10. For example, it may be decided that a globule DP has dripped when image data obtained in an image pickup area below position at a predetermined distance, such as a distance corresponding to the diameter of a globule dripped from the nozzle 10, below the tip of the nozzle 10 indicates a part or the whole of the globule, i.e., when the area of the image of the globule represented by the image data obtained in the image pickup area is not zero. The predetermined distance is not necessarily limited to a distance greater than the diameter of the dripped globule. For example, the predetermined distance may be shorter than the diameter of the dripped globule, and it may be decided that a globule DP is in a drippy state when the area of the image of the globule represented by the image data obtained in the image pickup area is smaller than a predetermined threshold or that a globule DP is in the dripping state when the area is greater than the predetermined threshold.

The main control unit 9a executes predetermined drip preventing operations and maintenance operations relating to maintenance management shown in Table 1 on the basis of information about the drippy state and the dripping state provided by the drip detecting unit 9b. Table 1 shows the levels of a drippy state and a dripping state, and the drip preventing operations and maintenance operations corresponding to those levels. Those operations include an operation for monitoring the tips of the nozzles 10 during the movement of the nozzle arm 11.

TABLE 1

|  |  | Used nozzles | | | Unused nozzles | | |
|---|---|---|---|---|---|---|---|
|  |  | Low-level dripping state | High-level dripping state | Dripping state | Low-level dripping state | High-level dripping state | Dripping state |
| Before pouring | | Dummy pouring after wet process | Dummy pouring before wet process | Stop wet process | Dummy pouring after wet process | Dummy pouring before wet process | Stop wet process |
|  |  | Count frequency of dripping lobules and display request for maintenance | Display request for maintenance | Display request for maintenance | Count frequency of dripping lobules and display request for maintenance | Display request for maintenance | Display request for maintenance |
| During pouring | |  |  |  | Dummy pouring after wet process | Dummy pouring after wet process | Stop wet process |
|  |  |  |  |  | Count frequency of dripping lobules and display request for maintenance | Display request for maintenance | Display request for maintenance |
| After pouring | | Dummy pouring | Dummy pouring | Stop wet process | Dummy pouring | Dummy pouring | Stop wet process |
|  |  | Count frequency of dripping lobules and display request for maintenance | Display request for maintenance | Display request for maintenance | Count frequency of dripping lobules and display request for maintenance | Display request for maintenance | Display request for maintenance |

Operations of the coating unit 1 for the decision of a drippy state and a dripping state at the tips of the nozzles 10 and for drip prevention will be described. In flow charts used for explaining those operations, the terms "low-level drippy state", "high-level drippy state" and "dripping state" will be used to express the condition of a globule.

Figure 6:
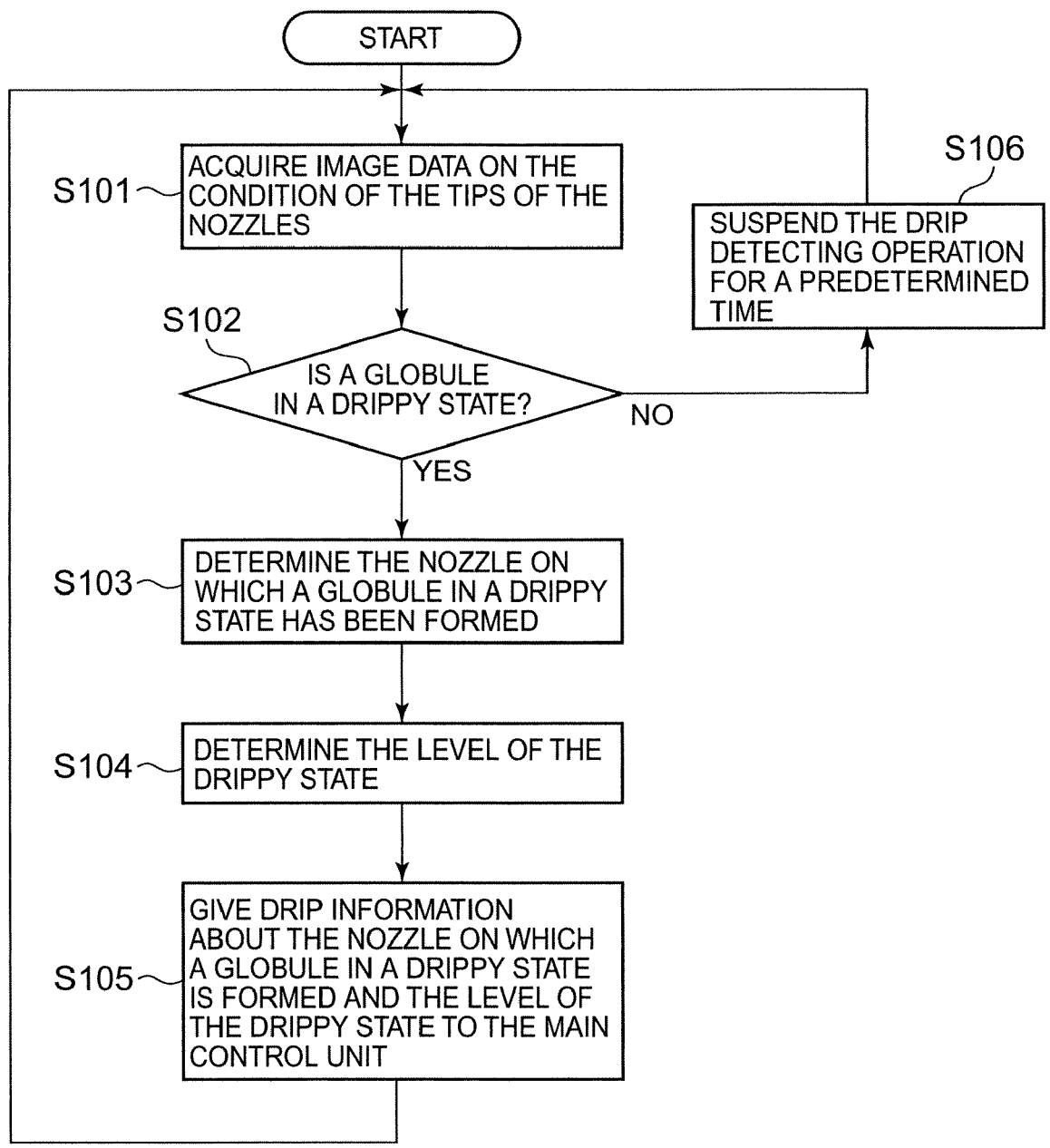
FIG. 6 is a flow chart of a drip detecting procedure.

First, a drip detecting procedure to be executed by the drip detecting unit 9b for deciding that a globule DP is in a dripping state will be described. FIG. 6 is a flow chart of the drip detecting procedure. The coating and developing system is started (START). In step S101, the drip detecting unit 9b acquires image data on the condition of the tips of the nozzles 10 in a predetermined period, for example, during dummy pouring or during processing operations. In step S102, the drip detecting unit 9b decides whether or not a globule in a drippy state has occurred by the foregoing drippy state decision method. If a globule in a drippy state has not occurred, i.e., if the response to a query made in step S102 is negative, the drip detecting unit 9b suspends the drip detecting operation, for example, for 200 ms in step S106, and then repeats steps S101 and S102.

If a globule in a drippy state is formed, i.e., if the response to a query made in step S102 is affirmative, the nozzle 10 on which a globule in a drippy state is formed is determined in step S103. Then, the drippy state is rated at a low-level drippy state, a high-level drippy state or a dripping state in step S104. The drip detecting unit 9b provides drip information about the nozzle 10 at which the globule in a drippy state is formed and the level of the drippy state in step S105. Then, the procedure returns to step S101 to acquire image data on the tips of the nozzles 10.

Figure 7:
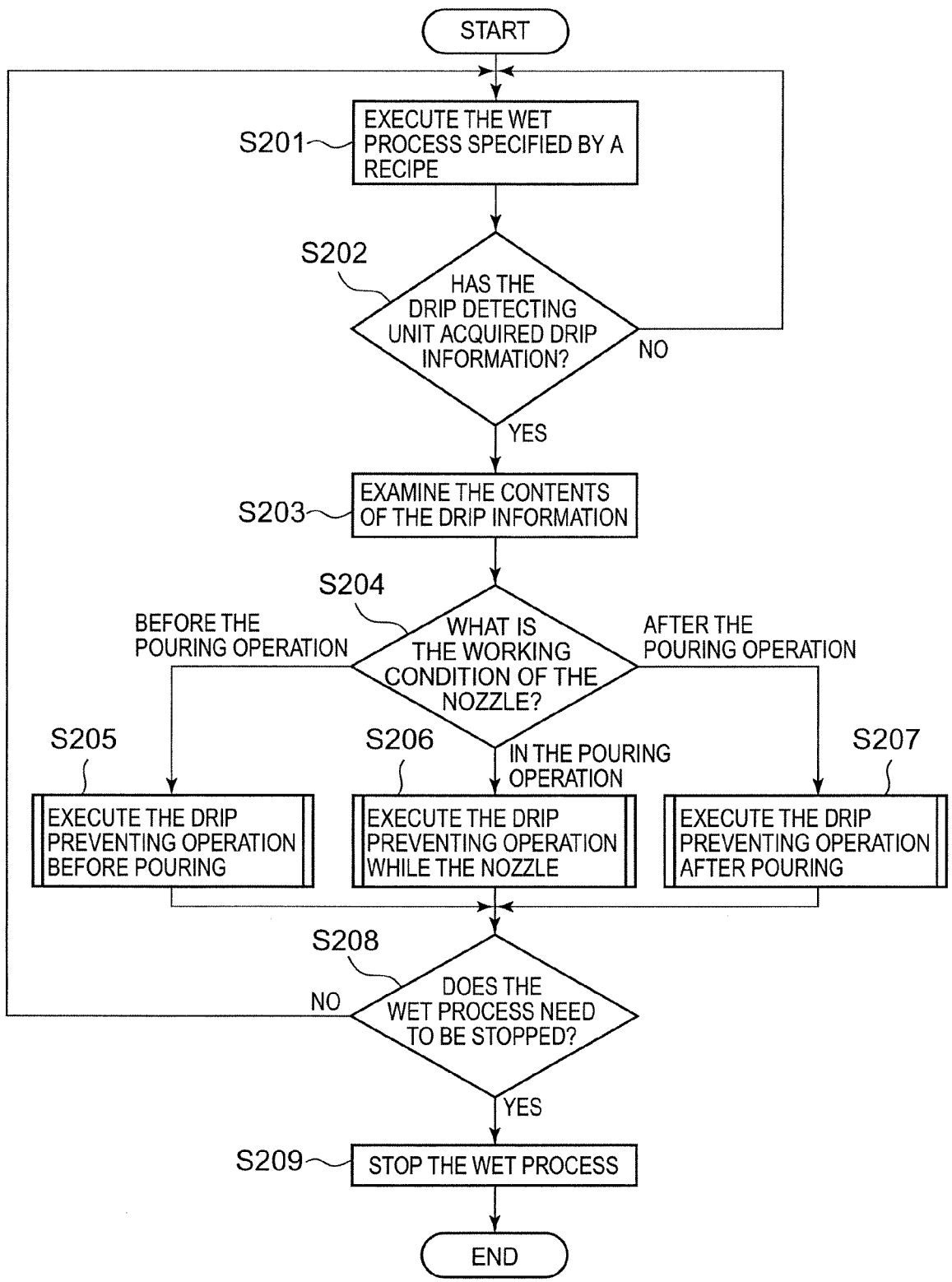
FIG. 7 is a flow chart of a procedure to be carried out by the coating unit upon the occurrence of a globule in a drippy state.

A drip preventing procedure and a maintenance procedure to be executed on the basis of the drip information provided by the drip preventing unit 9b will be described. FIG. 7 is a flow chart showing the drip preventing procedure. The coating and developing system is started (START). The coating unit 1 executes the wet process specified by a recipe for coating a wafer W with a resist solution in step S201. The wet process is continued until the drip detecting unit 9b acquires drip information, i.e., while the response to a query made in step S202 is negative.

When the drip detecting unit 9b acquires drip information, i.e., when the response to a query made in step S202 is affirmative, the contents of the drip information are examined in step S203, and the condition of the nozzle 10 is determined in step S204. A pre-pouring drip preventing procedure 9 (Step S205), a mid-pouring drip preventing procedure (S206) or a post-pouring drip preventing procedure (S207) is executed depending on the condition of the nozzle 10.

In step S208, a query is made to see whether or not the wet process needs to be stopped. If the response to the query made in step S208 is negative, the procedure returns to step S201. If the response to the query made in step S208 is affirmative and the wet process needs to be stopped, the wet process is stopped (the operation for carrying the succeeding wafer W into the coating unit 1 is stopped) in step S209, and then the drip preventing procedure is ended (END).

Figure 8:
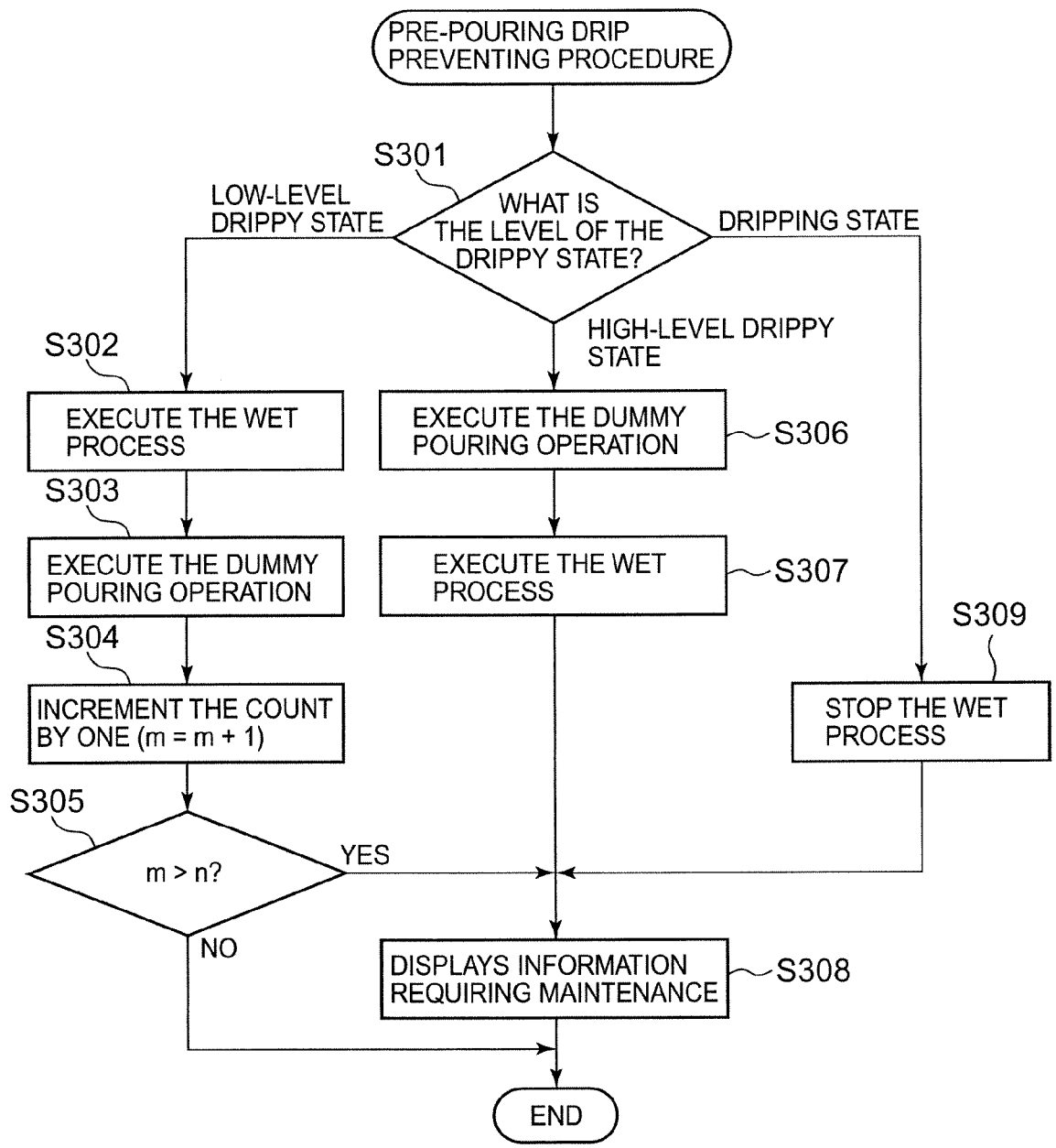
FIG. 8 is a flow chart of a drip preventing procedure to be executed when a drippy state is detected before the process solution is poured.

The contents of the drip preventing procedure will be described. One of the drip preventing procedures is selected depending on the condition of the nozzle 10. FIG. 8 is a flow chart of the pre-pouring drip preventing procedure to be executed in step S205 when the nozzle 10 is in a state before pouring the process solution.

The pre-pouring drip preventing procedure is started (START) when the nozzle 10 is in a state before pouring the process solution at the time the drip detecting unit 9b acquires the drip information. The level of the drippy state is determined in step S301. If it is decided in step S301 that the globule DP on the nozzle 10 is in a low-level drippy state, the wet process for applying a process solution to the wafer W is executed in step S302, the nozzles 10 are returned to the nozzle bath 14 or to the nearest one of the intermediate baths 16 (EBR nozzle baths 64), and then the nozzle 10 having a globule DP in a low-level drippy state is operated to discharge the process solution into the nozzle bath 14 or the intermediate bath 16 for a dummy pouring operation in step S303.

In step S304, a frequency m of occurrence of globules DP in a drippy state in the nozzle 10 counted by the counter 92 is incremented by one. In step S305, a query is made to see whether or not the frequency m is greater than a predetermined threshold frequency n. If the response to the query made in step S305 is negative, the pre-pouring drip preventing procedure is ended (END), and then step S208 (FIG. 7) is executed.

If the frequency m is greater than the predetermined threshold frequency n and the response to the query made in step S305 is affirmative, the display unit 8 displays information to the effect that the nozzle 10 needs maintenance in step S308, and then the pre-pouring drip preventing procedure is ended (END).

If it is decided in step S301 that the globule DP at the tip of the nozzle 10 is in a high-level drippy state, the nozzles 10 are returned to the nozzle bath 14 or to the nearest one of the intermediate nozzle baths 16, and then the nozzle 10 having a globule DP in a high-level drippy state is operated to discharge the process solution into the nozzle bath 14 or the intermediate bath 16 for a dummy pouring operation in step S306. Then, the wet process is executed in step S307. The display unit displays information to the effect that the nozzle 10 needs maintenance in step S308, and then the pre-pouring drip preventing procedure is ended (END).

If it is decided in step S301 that the globule DP formed on the nozzle 10 is in a dripping state, the wet process is stopped in step S309, the display unit displays information to the effect that the nozzle 10 needs maintenance in step S308, and then the pre-pouring drip preventing procedure is ended (END).

Figure 9:
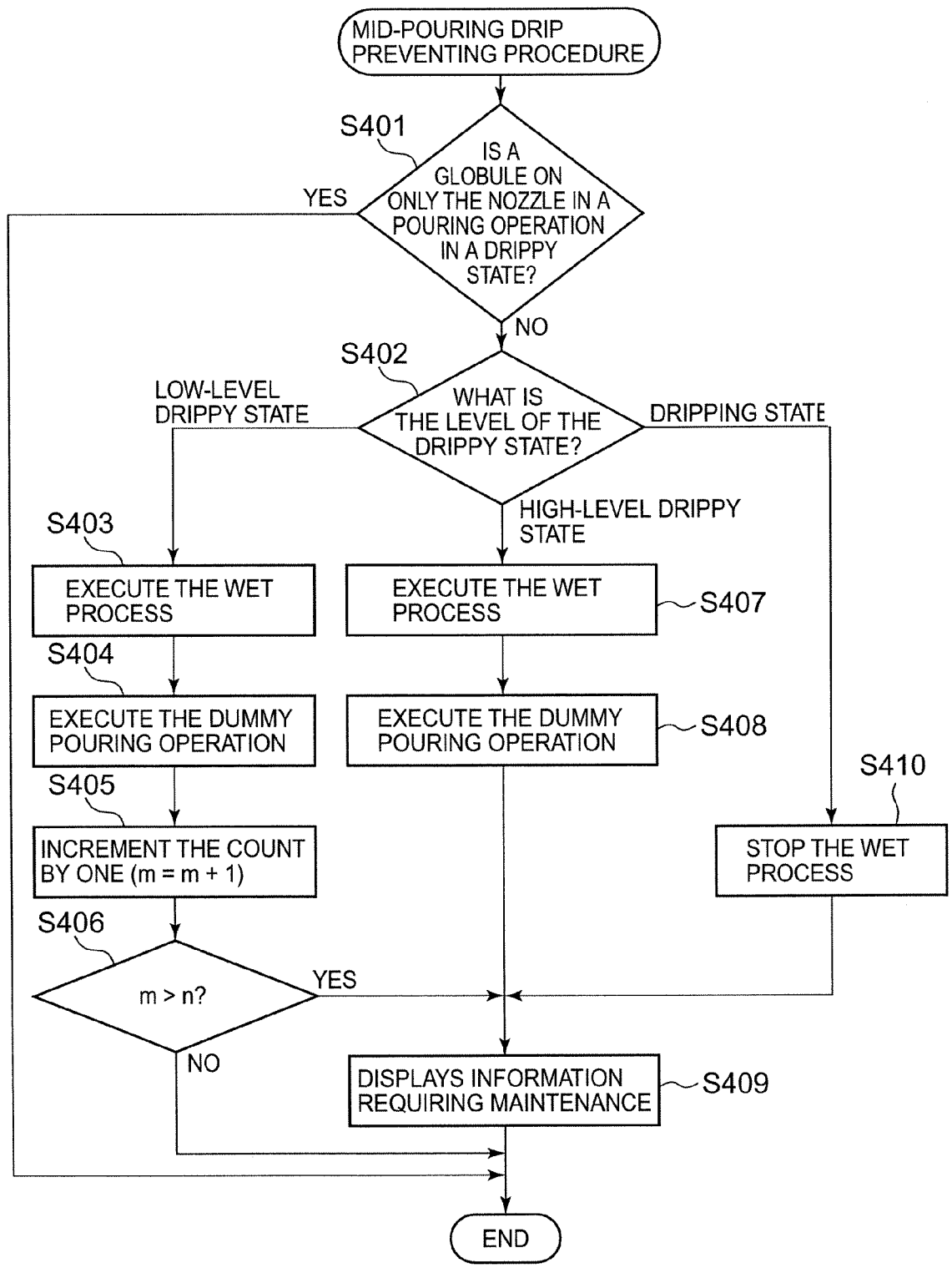
FIG. 9 is a flow chart of the drip preventing procedure to be executed during a process solution pouring operation.

The mid-pouring drip preventing procedure is executed when the nozzle 10 is pouring the process solution at time the drip detecting unit 9b acquires the drip information. FIG. 9 is a flow chart of the mid-pouring drip preventing procedure. The mid-pouring drip preventing procedure is executed in step S206 (FIG. 7) when the nozzle 10 is pouring the process solution at time the drip detecting unit 9b acquires the drip information. FIG. 9 is a flow chart of the mid-pouring drip preventing procedure to be executed in step S206.

Referring to FIG. 9, a query is made in step S401 to see whether or not a globule DP at the tip of only the nozzle 10 in a pouring operation is in a drippy state. If the response to the query made in step S401 is affirmative, i.e., if only the globule DP on the nozzle in a pouring operation is in a drippy state, the mid-pouring drip preventing procedure is ended (END). The mid-pouring drip preventing procedure is thus ended to avoid mistaking a state in which the process solution is being poured through the nozzle 10 for a dripping state. If the response to the query made in step S401 is negative, i.e., if a globule DP at the tip of the nozzle 10 other than the nozzle 10 pouring the process solution is in a drippy state, the level of the drippy state is determined in step S402. If it is decided in step S402 that the globule DP is in a high-level drippy state, the wet process is executed in step S407, and a dummy pouring operation is executed in step S408. Steps following step S408 are exactly the same as those following step S307 shown in FIG. 8, and hence the description thereof will be omitted.

The dummy pouring operation may be executed after interrupting the wet process in step S407 instead of after completing the wet process in step S407.

Figure 10:
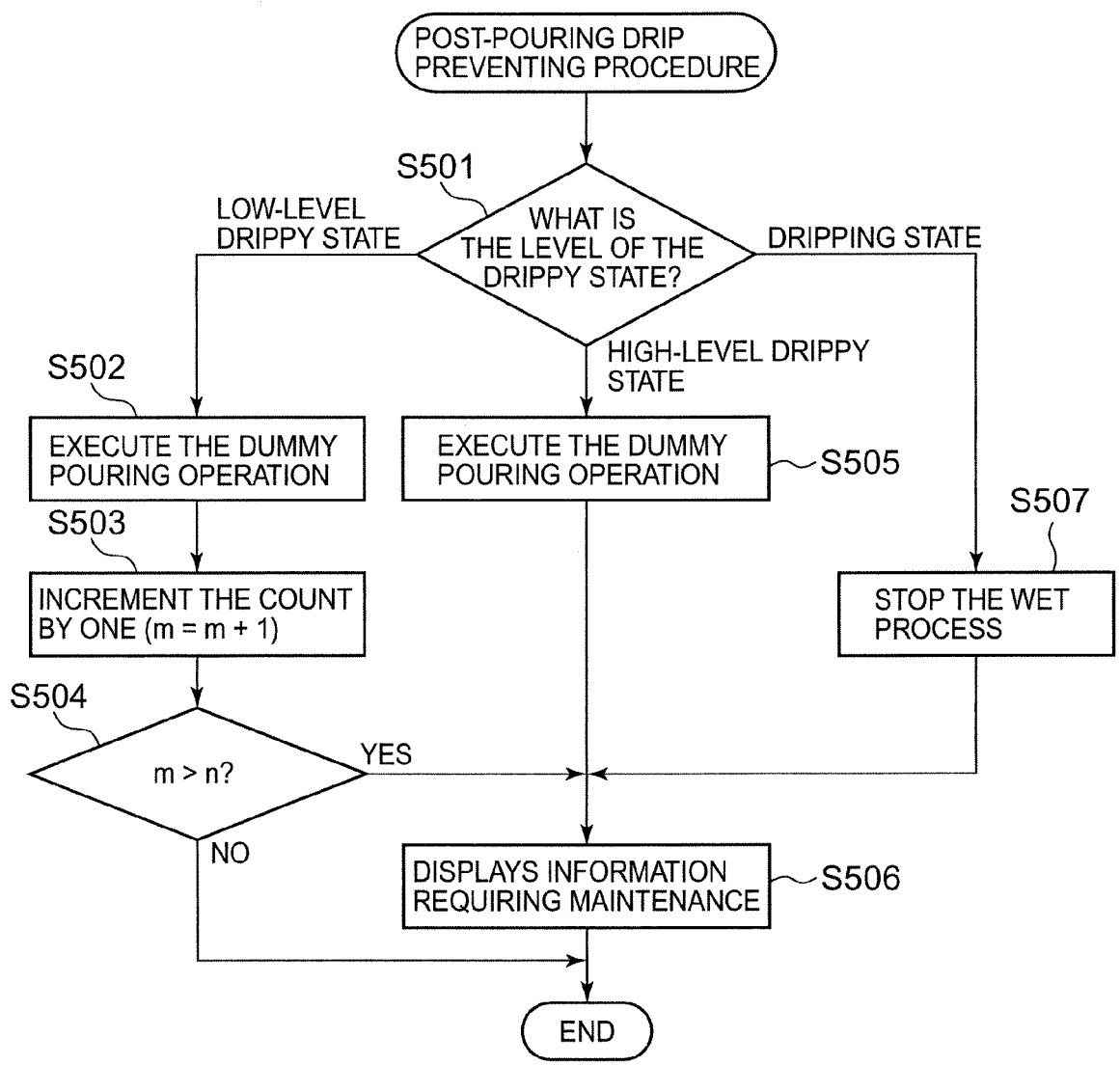
FIG. 10 is a flow chart of the drip preventing procedure to be executed after the completion of the process solution pouring operation.

The post-pouring drip preventing procedure is executed when the drip detecting unit 9b acquires the drip information after the nozzle 10 has completed pouring the process solution. FIG. 10 is a flow chart of the post-pouring drip preventing procedure to be executed in step S207.

The post-pouring drip preventing procedure closely resembles the mid-pouring drip preventing procedure shown in FIG. 8 and differs from the mid-pouring drip preventing procedure in that the nozzles 10 are retracted without executing the wet process and the dummy pouring operation is executed if it is decided in step S501 that a globule DP at the tip of the nozzle 10 is in a low-level drippy state and that the wet process is not executed after the dummy pouring operation if it is decided in step S501 that a globule DP at the tip of the nozzle 10 is in a high-level drippy state. The post-pouring drip preventing procedure is the same in other respects as the mid-pouring drip preventing procedure and hence the further description of the post-pouring drip preventing procedure will be omitted.

This embodiment of the present invention has the following effects. The camera 17 moves together with the nozzles 10 to obtain an optical image of the tips of the nozzles 10 while the nozzles 10 are moving. Therefore, a globule in a drippy or dripping state occurred during the movement of the nozzles 10 can be detected. Therefore proper measures can be taken according to the condition of the nozzles 10. If it is decided that a globule DP is in a drippy state, the nozzles 10 are moved to the nozzle bath 14 or the intermediate bath 16 and the dummy pouring operation is executed to discharge the process solution into the nozzle bath 14 or the intermediate bath 16. If it is decided that a globule DP is dripping, the wet process is stopped. Prevention of the drip of the process solution at a position other than a desired position can prevent producing an unacceptable product and improves yield. Even if the drip of the process solution at a position other than a desired position could not be prevented, proper measures, such as wiping of the dripped process solution, can be taken without delay by automatically stopping the coating and the developing system. Thus the expansion of defects can be suppressed and the loss can be limited to a minimum.

It is a particular feature of this embodiment that the nozzle arm 11 of the nozzle carrying mechanism 10a holds plural nozzles 10, namely, the ten nozzles 10, all the nozzles 10 are moved together, and the plural wet processing devices 2, namely, the three wet processing devices 2, share the nozzles 10 and the nozzle carrying mechanism 10a. Therefore, the probability of dripping the resist solution is higher than the probability when a single nozzle 10 is held by the nozzle carrying arm 11 or when the wet processing devices 2 are individually provided with the nozzles 10, respectively, and hence the effect of the drip preventing measures on improving the yield and reducing losses increases still further.

The cameral 17 is combined with the nozzle carrying mechanism 10a. Therefore any mechanism specially for moving the camera 17 is not necessary and hence the equipment cost is low. The camera 17 may be combined with a camera moving mechanism separate from the nozzle carrying mechanism 10a, and those mechanisms may be synchronously operated to match the movement of the camera 17 with that of the nozzles 10 to obtain an image of the tips of the nozzles 10.

The use of the camera 17, namely, an optical image pickup means, enables obtaining image data on the globule DP, such as the curvature of the globule DP. Thus, it is possible to obtain not only the occurrence of a globule DP in a drippy state but also the size of the globule DP. Therefore, the dummy pouring operation can be executed after the wet process has been completed when the globule DP is small or can be executed before the wet process when the globule DP is large. Thus proper measures can be taken according to the significance of the condition of the nozzles 10. Consequently, loss time that lowers the efficiency of the wet process, such as an idle time for which the coating unit is held inoperative during the dummy pouring operation, can be limited to a minimum.

The intermediate baths 16 are disposed in the spaces between the adjacent ones of the three wet processing devices 2 to avoid moving the nozzles 10 from a position above the spin chuck 41 of one of the wet processing devices 2 to the intermediate bath 16 to execute the dummy pouring operation without crossing the spin chucks 41 of the other wet processing deices 2. Therefore, a distance by which the nozzles 10 need to be moved fore the foregoing purpose is shorter than a distance by which the nozzles 10 need to be moved when the coating unit 1 is provided with only the nozzle bath 14, and a danger of growth drip of the globule can be lowered.

A large globule and a dripping globule are displayed by the display unit 8, The frequency of occurrence of globules DP even in a low-level drippy state is counted. When the frequency is greater than the threshold frequency, the display unit 8 displays information to the effect that the nozzle 10 needs maintenance. Consequently, the operator and the maintenance staff can immediately take proper measures.

The method of taking an optical image of the tips of the nozzles 10 is not limited to that using the camera 17. For example, images of drippy globules and dripping globules may be obtained by converting a thermal image of the tips of the nozzles 10 into image data by an infrared camera. When an infrared camera is used for obtaining the image data, a light source that emits infrared or near-infrared rays may be used instead of the light source provided with the LED lamp for illuminating the tips of the nozzles 10.

The nozzles 10 may be made of a transparent material, and the end parts of the nozzles 10 may be optically monitored to find bubbles in the process solutions in the end parts of the nozzle 10. The amount of the poured process solution may be calculated on the basis of the thickness of a stream of the process solution poured through the nozzle 10 and the duration of pouring to monitor the pouring performance of the nozzle 10. The pouring performance of the nozzle 10 may be monitored by calculating $V=L/T$, where V is pouring speed, L is distance between the tip of the nozzle 10 and the end surface of the process solution retracted into the end part of the nozzle 10, and T is time interval between the time the main control unit 9a (coating control means) gives a process solution supply start signal to the process solution supply mechanism 70 and the time an image of a globule of the process solution at the tip of the nozzle 10 is obtained. Monitoring the pouring performance is necessary because the process solution is dispersed in mist and the spin coating operation results in failure if the pouring speed is excessively low due to formation of bubbles in the process solution in the end part of the nozzle 10.

Although the nozzle carrying mechanism 10a in this embodiment carries the ten nozzles 10, the nozzle carrying mechanism 10a does not necessarily carry plural nozzles 10 and may carry, for example, a single nozzle. The number of the wet processing devices 2 is not limited to three. The present invention is applicable to a coating unit provided with one nozzle 10 and one nozzle carrying mechanism 10a disposed in one box 30.

The use of the camera 17 for obtaining an image of the nozzles 10 is not limited to monitoring globules of the process solution in the drippy state as mentioned in the description of the embodiment. In some cases, for example, a dummy substrate, which is not processed actually, is carried into the coating and developing system for the adjustment of a position to which a wafer W is to be carried before the start of the coating and developing system. In such a case using the dummy substrate, the camera 17 may be used for finding and adjusting the position of the nozzles. The camera 17 may be used for visually recognizing a globule of the process solution in the drippy state during the execution of the normal process. When the camera 17 is used for such a purpose, the colored light emitted by the light source 19 may be changed for white light to facilitate the visual recognition of a globule in the drippy state by the operator.

Figure 11:
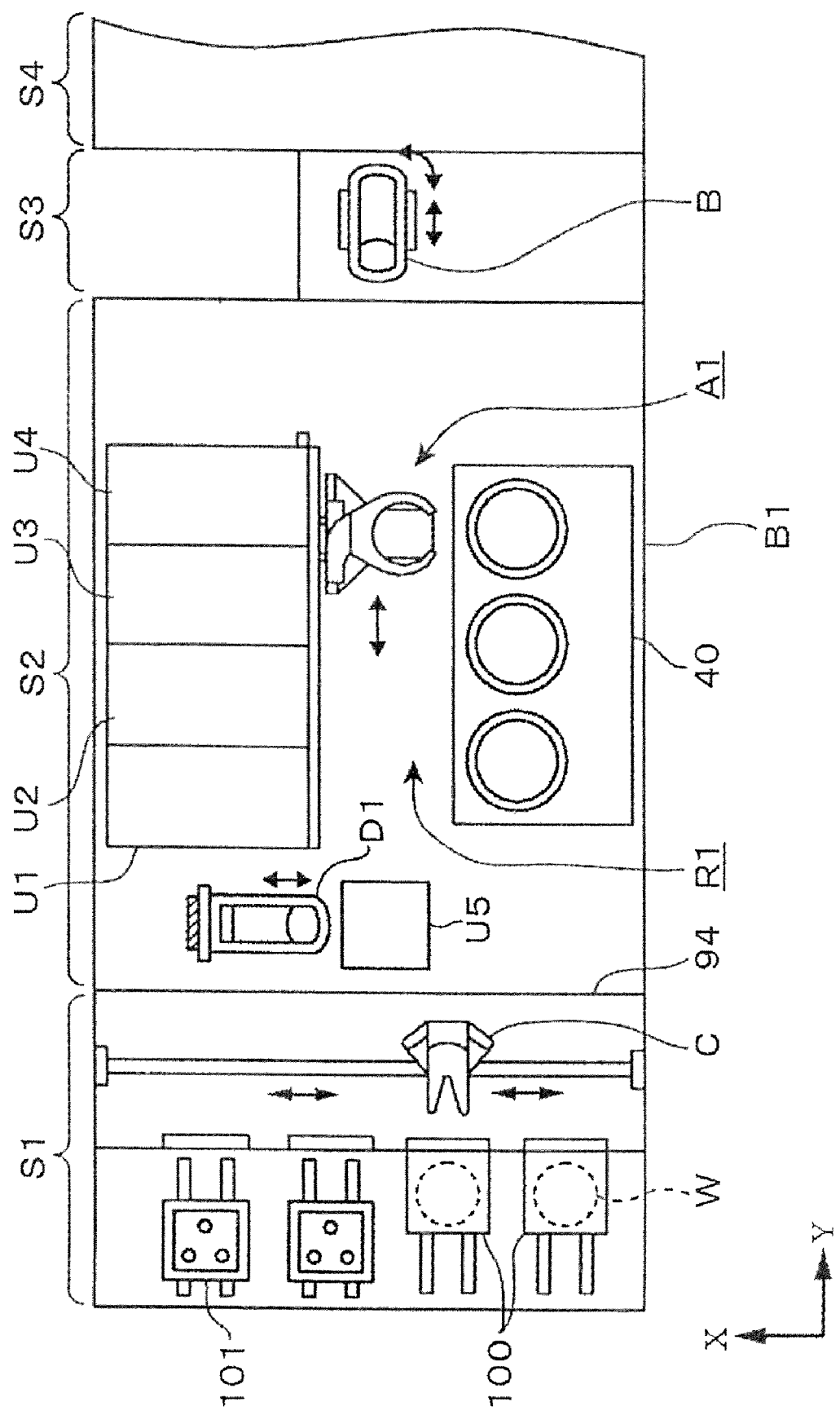
FIG. 11 is a plan view of a coating and developing system in a preferred embodiment according to the present invention including the coating unit shown in FIG. 1.
Figure 12:
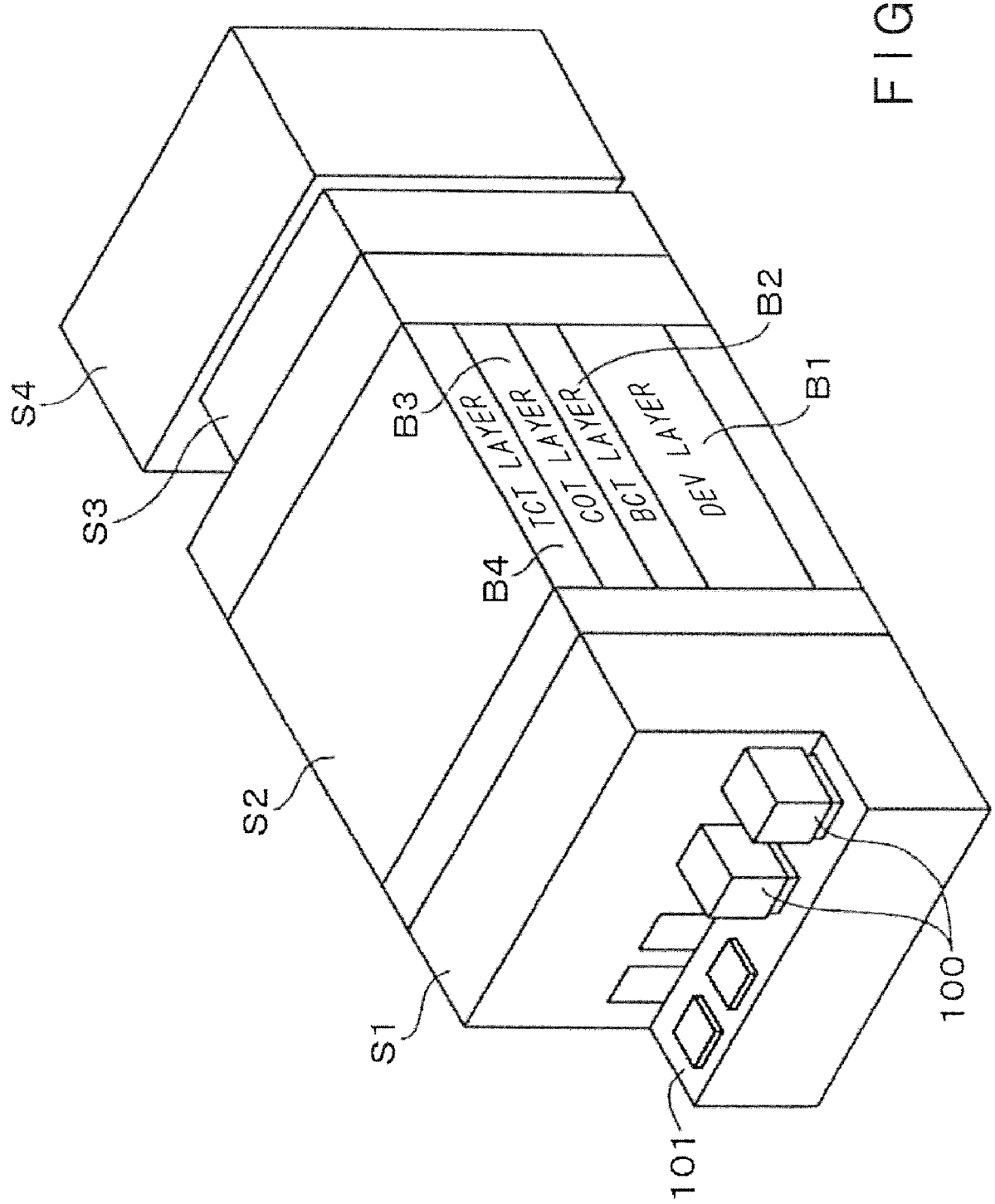
FIG. 12 is a perspective view of the coating and developing system shown in FIG. 11.
Figure 13:
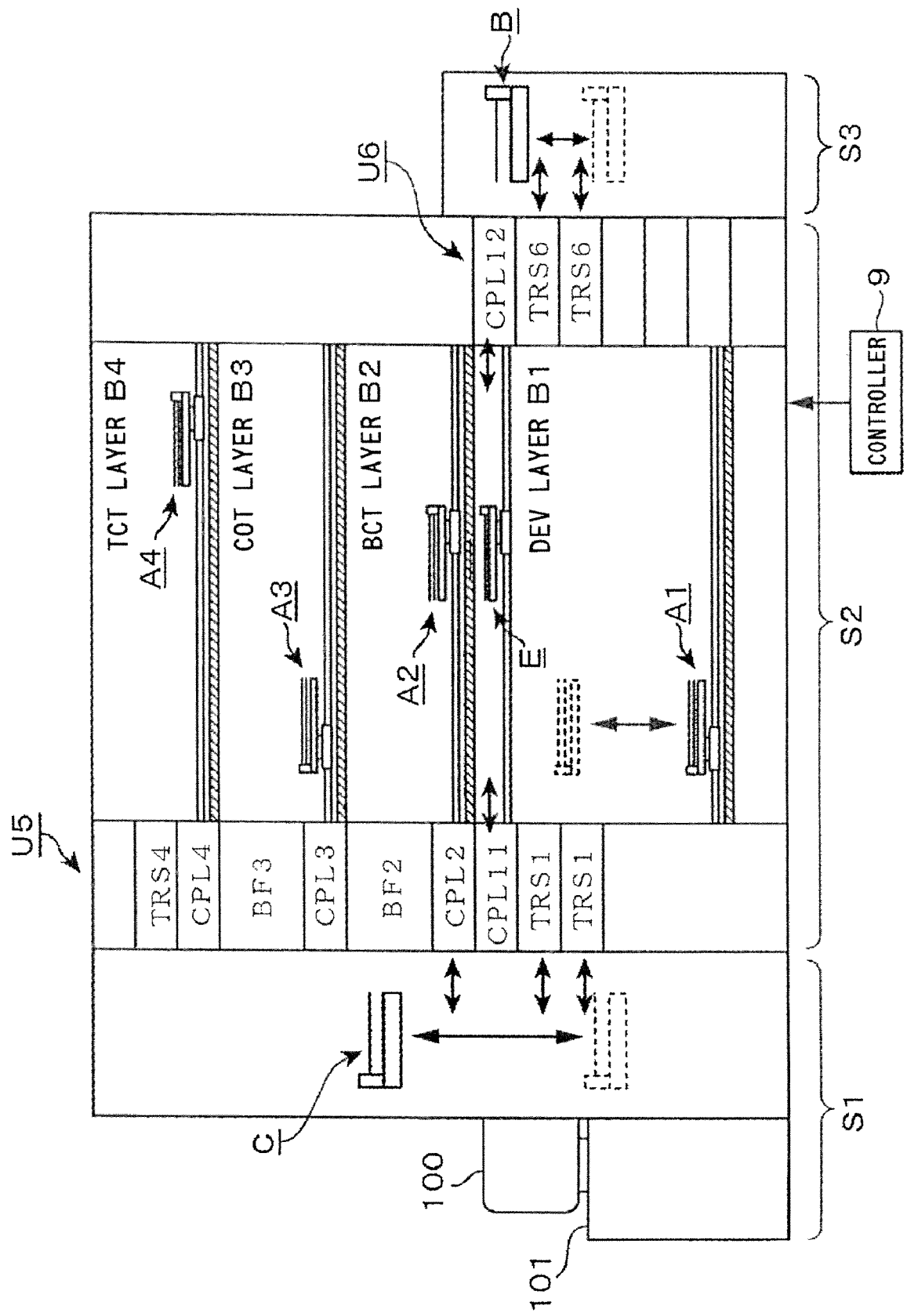
FIG. 13 is a longitudinal sectional view of the coating and developing system shown in FIG. 11.

A coating and developing system including the coating unit 1 will be briefly described. FIG. 11 is a plan view of the coating and developing system, FIG. 12 is a perspective view of the coating and developing system, and FIG. 13 is a longitudinal sectional view of the coating and developing system. The coating and developing system has a carrier block S1. A transfer arm C takes out a wafer W from an airtight carrier 100 placed on a carrier mount 101 and transfers the same to a processing block S2. The transfer arm C receives a processed wafer W from the processing block S2 and returns the same into the carrier 100.

Referring to FIG. 12, the processing block S2 includes a first block (DEV layer) B1 for carrying out a developing process, a second block (BCT layer) B2 for carrying out an antireflection film forming process for forming an antireflection film under a resist film, a third block (COT layer) B3 for forming a resist film, and a fourth block (TCT layer) B4 for forming an antireflection film on a resist film, which are stacked in that order from the bottom upward.

Each of the second block (BCT layer) B2 and the fourth block (TCT layer) B4 includes the coating unit 1 in the foregoing embodiment for coating a surface of a wafer W with a chemical solution for forming an antireflection film by a spin coating process, heating and cooling processing units for processing a wafer before and after the process executed by the coating unit 1, and carrying arms A2 and A4 installed the coating unit 1 and the group of the processing units to carry a wafer W between them. The third block (COT layer) B3 is similar to the second block (BCT layer) B2 and the fourth block (TCT layer) B4, except that the third block (COT layer) B3 uses a resist solution, Referring to FIG. 13, the first block (DEV layer) B1 has two developing units stacked in two layers. The DEV layer B1 is provided with a carrying arm A1 for carrying a wafer W to those developing units. The carrying arm A1 works for both the developing units stacked in two layers.

As shown in FIGS. 11 and 13, the processing block S2 has a shelf unit U5. Wafers W are carried successively from the carrier block S1 to one of the transfer units of the shelf unit U5, for example, a transfer unit CPL2, by a vertically movable first transfer arm D1 disposed near the shelf unit U5. The carrying arm A2 of the second block (BCT layer) B2 receives a wafer W from the transfer unit CPL2 and carries the wafer W to the antireflection film forming unit and the group of the heating and cooling units. An antireflection film is formed on the wafer W by processing the wafer W by the antireflection film forming unit and the group of the heating and cooling units.

Subsequently, the wafer W is carried via a transfer unit BF2 of the shelf unit U5, the transfer arm D1, a transfer unit CPL3 of the shelf unit U5 and the carrying arm A3 to the third block (COT layer) B3 to form a resist film on the wafer W. Then, the wafer W is carried via the carrying arm A3, a transfer unit BF3 of the shelf unit U5 and the transfer arm D1 to a transfer unit CPL11 of the shelf unit U5. In some cases, the wafer W coated with a resist film is processed by the fourth block (TCT layer) B4 to form an antireflection film on the resist film. In such a case, the wafer W is transferred through a transfer unit CPL4 to the carrying arm A4 and, after the antireflection film has been formed on the resist film, the wafer W is transferred to a transfer unit TRS4 by the carrying arm A4.

A shuttle arm E (carrying means) is installed in an upper part of the DEV layer B1. The shuttle arm E is used specially for carrying a wafer W from the transfer unit CPL11 of the shelf unit U5 directly to a transfer unit CPL12 of a shelf unit U6. The wafer W coated with the resist film and the antireflection film is transferred via the first transfer arm D1, the transfer units BF3 and TRS4 to the transfer unit CPL11. Then, the shuttle arm E carries the wafer W from the transfer unit CPL11 directly to the transfer unit CPL12 of the shelf unit U6. Subsequently, the wafer W is transferred from the transfer unit CPL12 to an interface block S3. In FIG. 13, the transfer units designated by "CPL" serve also as cooling units for temperature control, and the transfer units designated by "BF" serve also as buffer units capable of holding plural wafers.

Then, an interface arm B carries the wafer W to an exposure system S4. After the wafer W wafer W has been processed by a predetermined exposure process, the wafer W is returned through a transfer unit TRS6 of the shelf unit U6 to the processing block S2. Then, the wafer W is subjected to a developing process in the first block (DEV layer) B1. The carrying arm A1 carries the wafer W processed by the developing process to a transfer stage TRS1 of the shelf unit U5. Then, the transfer arm C returns the wafer W to the carrier 100. In FIG. 11, indicated at U1 to U4 are thermal units each formed by stacking a heating unit and a cooling unit.

What is claimed is:

1. A wet processing system for pouring a process solution supplied by a process solution supply unit through a process solution pouring nozzle onto a surface of a substrate held substantially horizontally by a substrate holding device surrounded by a cup to process the surface by a wet process, said wet processing system comprising:

a nozzle bath for holding process solution pouring nozzles thereon at a home position;

a nozzle carrying mechanism for carrying the process solution pouring nozzles between the home position on the nozzle bath and a position above the substrate held by the substrate holding device;

an image pickup means for taking a picture of tips of the process solution pouring nozzles while the process solution pouring nozzles are being carried by the nozzle carrying mechanism;

a decision means for deciding whether or not a globule of the process solution is in a drippy state, in which the globule of the process solution protrudes down from a tip of a process solution pouring nozzle prior to being discharged, and whether or not the globule of the process solution is in a dripping state, in which the process solution has dripped off a tip of a process solution pouring nozzle, on the basis of image data provided by the image pickup means; and a control means for making the process solution supply unit and/or the nozzle carrying mechanism execute a drip preventing operation to cope with a drippy state where a globule of the process solution is drippy or a dripping state where a globule of the process solution is dripping when the decision means decides that the globule of the process solution is in the drippy or the dripping state.

2. The wet processing system according to claim 1, wherein the nozzle carrying mechanism carries the plural process solution pouring nozzles simultaneously, and the decision means identifies each of the process solution pouring nozzles by image data provided by the image pickup means, and decides whether or not the process solution is in the drippy or dripping state on the basis of the image data.

3. The wet processing system according to claim 1, wherein the control means stops making the process solution supply unit and/or the nozzle carrying mechanism execute the drip preventing operation on the basis of the image data on the process solution pouring nozzle in a process solution pouring operation.

4. The wet processing system according to claim 1, wherein the image pickup means is combined with the nozzle carrying mechanism.

5. The wet processing system according to claim 1, wherein the image pickup means is a camera provided with an image sensor.

6. The wet processing system according to claim 1 further comprising a light source for illuminating the process solution pouring nozzle when the image pickup means obtains an image of the process solution pouring nozzle.

7. The wet processing system according to claim 1 further comprising a first storage means storing reference information including a criterion for deciding whether or not a globule of the process solution is in the drippy state and determines the size of a globule of the process solution formed at the tip of the process solution pouring nozzle on the basis of results of comparison of the image data and the reference information.

8. The wet processing system according to claim 7, wherein the reference information and the image data are those relating to a curvature or a sectional area of the globule of the process solution in the drippy state.

9. The wet processing system according to claim 1 further comprising a second storage means for storing image data obtained in the past;
wherein the decision means compares the past image data obtained at a past time a predetermined period ago and the present image data obtained at the present, and decides that a globule of the process solution has dripped when the size of a globule represented by the present image data is smaller than that of a globule represented by the past image data.

10. The wet processing system according to claim 1, wherein the decision means decides that a globule of the process solution has dripped when image data obtained at a position in an image pickup area at a predetermined distance below the tips of the process solution pouring nozzles indicates a part or the whole of a globule of the process solution.

11. The wet processing system according to claim 1, wherein the process solution pouring nozzles are made of a transparent material, and the decision means further decide whether or not bubbles are found in the process solution in an end part of each of the process solution pouring nozzles on the basis of the image data provided by the image pickup means.

12. The wet processing system according to claim 1, wherein the decision means calculates an amount of the process solution poured through each of the process solution pouring nozzles on the basis of a thickness of a stream of the process solution poured through the process solution pouring nozzle and time for which the process solution is poured represented by the image data.

13. The wet processing system according to claim 1 further comprising a suck back valve for retracting the process solution into an end part of each of the process solution pouring nozzles, and a coating operation control means that gives a process solution supply start signal to the process solution supply unit;
wherein the decision means calculates a pouring speed at which the process solution is poured on the basis of a distance by which the process solution has been retracted behind the tip of the process solution pouring nozzle by the agency of the suck back valve, and time between a time the coating operation control means provided the process solution supply start signal and a time image data representing the process solution at the tip of the process solution pouring nozzle is obtained.

14. The wet processing system according to claim 1, wherein the drip preventing operation includes the steps of returning the process solution pouring nozzles back to the nozzle bath and discharging the process solution through each of the process solution pouring nozzles into the nozzle bath.

15. The wet processing system according to claim 14, wherein the control means execute the drip preventing operation after completing pouring the process solution onto the substrate held by the substrate holding device when an image of a globule of the process solution is obtained during a nozzle carrying operation for carrying the process solution pouring nozzles to the position for pouring the process solution to pour the process solution onto the surface of the substrate.

16. The wet processing system according to claim 14, wherein the control means execute the drip preventing operation before starting pouring the process solution onto a substrate held by the substrate holding device when an image of a globule of the process solution is obtained during a nozzle carrying operation for carrying the process solution pouring nozzles to the position for pouring the process solution to pour the process solution onto the surface of the substrate.

17. The wet processing system according to claim 14, wherein plural wet processing devices each having the cup and the substrate holding device are arranged laterally in a line in a common box, and the plural wet processing devices share the process solution pouring nozzles and the nozzle carrying mechanism, and
intermediate baths are disposed each between the adjacent ones of the wet processing devices arranged in the box to move the process solution pouring nozzles thereto and to make the process solution pouring nozzles execute the drip preventing operation thereon.

18. The wet processing system according to claim 1, wherein the drip preventing operation stops carrying a succeeding substrate into the wet processing system.

19. The wet processing system according to claim 1 further comprising a warning means for giving a warning to the effect that the globule of the process solution is in the drippy or dripping state when it is decided by the decision means that the globule of the process solution is in the drippy or dripping state.

20. The wet processing system according to claim 19 further comprising counters respectively combined with the process solution pouring nozzles to count frequencies of globules of the process solution in the drippy state occurred in the process solution pouring nozzles; wherein the warning means gives a warning to the effect that the process solution is drippy or dripping when the frequency of drippy or dripping globules occurred in any one of the process solution pouring nozzles is greater than a predetermined frequency.

21. The wet processing system according to claim 1, wherein plural wet processing devices each having the cup and the substrate holding device are arranged laterally in a line in a common box, and the plural wet processing devices share the process solution pouring nozzles and the nozzle carrying mechanism.

* * * * *